(12) United States Patent 
Ito et al.

(10) Patent No.: US 12,699,888 B2 
(45) Date of Patent: Aug. 4, 2026

(54) SEMICONDUCTOR DEVICE

(71) Applicant: SEMICONDUCTOR ENERGY LABORATORY CO., LTD., Atsugi (JP)

(72) Inventors: Minato Ito, Atsugi (JP); Munehiro Kozuma, Atsugi (JP); Yuki Okamoto, Ebina (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 997 days.

(21) Appl. No.: 17/906,085

(22) PCT Filed: Mar. 22, 2021

(86) PCT No.: PCT/IB2021/052351 
§ 371 (c)(1), 
(2) Date: Sep. 12, 2022

(87) PCT Pub. No.: WO2021/198841 
PCT Pub. Date: Oct. 7, 2021

(65) Prior Publication Data 
US 2023/0109354 A1 Apr. 6, 2023

(30) Foreign Application Priority Data 
Apr. 3, 2020 (JP) ................................. 2020-067168

(51) Int. Cl. 
G06N 3/063 (2023.01) 
G06F 7/544 (2006.01) 
H10D 30/67 (2025.01)

(52) U.S. Cl. 
CPC ........... *G06N 3/063* (2013.01); *G06F 7/5443* (2013.01); *H10D 30/6755* (2025.01)

(58) Field of Classification Search 
CPC ................. H10D 30/6755; G06N 3/06; G06N 3/063–065; G06F 15/7821; G06F 7/5443 
See application file for complete search history.

(56) References Cited

U.S. PATENT DOCUMENTS

| | | | |
|---|---|---|---|
| 5,444,822 A | 8/1995 | Shinohara | |
| 6,057,885 A | 5/2000 | Horishi et al. | |
| | (Continued) | | |

FOREIGN PATENT DOCUMENTS

| | | |
|---|---|---|
| CN | 108364061 A | 8/2018 |
| CN | 109560078 A | 4/2019 |
| | (Continued) | |

OTHER PUBLICATIONS

International Search Report (Application No. PCT/IB2021/052351) Dated Jun. 29, 2021.

(Continued)

*Primary Examiner* — Matthew D Sandifer 
(74) *Attorney, Agent, or Firm* — Fish & Richardson P.C.

(57) ABSTRACT

A semiconductor device with a novel structure is provided. The semiconductor device includes a plurality of memory circuits, a switching circuit, a first arithmetic circuit, and a second arithmetic circuit. The plurality of memory circuits each have a function of retaining weight data. The switching circuit has a function of switching electrical continuity and discontinuity between any one of the memory circuits and the first arithmetic circuit. The first arithmetic circuit outputs a first output signal based on product-sum operation processing of input data and the weight data selected by the switching circuit to the second arithmetic circuit. A layer including the plurality of memory circuits is provided to be stacked over a layer including the switching circuit, the first arithmetic circuit, and the second arithmetic circuit.

12 Claims, 27 Drawing Sheets

(56) References Cited

U.S. PATENT DOCUMENTS

| | | | |
|---|---|---|---|
| 6,452,237 B1 | 9/2002 | Varshavsky | |
| 6,470,328 B1 | 10/2002 | Varshavsky | |
| 8,472,235 B2 | 6/2013 | Kozuma et al. | |
| 9,716,852 B2 | 7/2017 | Kurokawa | |
| 9,851,942 B2 | 12/2017 | Kurokawa | |
| 10,141,069 B2 | 11/2018 | Ikeda et al. | |
| 10,553,260 B2 | 2/2020 | Shin et al. | |
| 10,923,165 B2 | 2/2021 | Shin et al. | |
| 11,114,139 B2 | 9/2021 | Shin et al. | |
| 11,221,827 B1 * | 1/2022 | Hsu | G06F 7/501 |
| 11,314,484 B2 | 4/2022 | Kozuma et al. | |
| 2011/0235389 A1 | 9/2011 | Kozuma et al. | |
| 2012/0033488 A1 | 2/2012 | Nagatsuka et al. | |
| 2016/0172410 A1 | 6/2016 | Kurokawa | |
| 2016/0295152 A1 | 10/2016 | Kurokawa | |
| 2016/0343452 A1 | 11/2016 | Ikeda et al. | |
| 2017/0063351 A1 | 3/2017 | Kurokawa | |
| 2017/0116512 A1 | 4/2017 | Kurokawa | |
| 2017/0118479 A1 | 4/2017 | Kurokawa | |
| 2017/0220891 A1 | 8/2017 | Kim et al. | |
| 2017/0263291 A1 | 9/2017 | Kurokawa | |
| 2017/0270405 A1 | 9/2017 | Kurokawa | |
| 2017/0317085 A1 | 11/2017 | Kurokawa | |
| 2019/0096453 A1 | 3/2019 | Shin et al. | |
| 2019/0164620 A1 | 5/2019 | Ikeda et al. | |
| 2019/0251424 A1 | 8/2019 | Zhou et al. | |
| 2020/0110990 A1 | 4/2020 | Harada et al. | |
| 2020/0201603 A1 | 6/2020 | Kozuma et al. | |
| 2021/0151106 A1 * | 5/2021 | Wang | G06F 17/16 |
| 2022/0276838 A1 | 9/2022 | Kozuma et al. | |
| 2022/0343954 A1 * | 10/2022 | Aoki | G11C 7/08 |
| 2023/0055062 A1 * | 2/2023 | Okamoto | G11C 11/405 |

FOREIGN PATENT DOCUMENTS

| | | | | | |
|---|---|---|---|---|---|
| EP | 3255606 A | 12/2017 | | | |
| EP | 3525138 A | 8/2019 | | | |
| JP | 2011-222985 A | 11/2011 | | | |
| JP | 2017107558 A | * | 6/2017 | ............... | G11C 8/12 |
| JP | 2018-201003 A | 12/2018 | | | |
| JP | 2019-036280 A | 3/2019 | | | |
| JP | 2019-061677 A | 4/2019 | | | |
| JP | 2019-139747 A | 8/2019 | | | |
| KR | 2019-0036358 A | 4/2019 | | | |
| WO | WO-2011/118351 | 9/2011 | | | |
| WO | WO-2018/211349 | 11/2018 | | | |
| WO | WO-2019/078924 | 4/2019 | | | |

OTHER PUBLICATIONS

Written Opinion (Application No. PCT/IB2021/052351) Dated Jun. 29, 2021.

Pelayo.J et al., "CMOS Implementation of Synapse Matrices With Programmable Analog Weights", Lecture Notes in Computer Science, 1991, vol. 540, pp. 307-314.

Prieto.A et al., "Simulation and Hardware Implementation of Competitive Learning Neural Networks", Statistical Mechanics of Neural Networks. Lecture Notes in Physics, 1990, vol. 368, pp. 189-204.

Aslam-Siddiqi.A et al., "A 16×16 Nonvolatile Programmable Analog Vector-Matrix Multiplier", IEEE Journal of Solid-State Circuits, Oct. 1, 1998, vol. 33, No. 10, pp. 1502-1509.

Merrikh Bayat.F et al., "Redesigning Commercial Floating-Gate Memory for Analog Computing Applications", ISCAS 2015 (IEEE International Symposium on Circuits and Systems), May 1, 2015, pp. 1921-1924.

* cited by examiner

QUA[1]-QUA[3]

45

CLK
⇨

44    55    56    44    55    56    46_1

45

CLK
⇨

44    55    56    PPD[1]

QUA[4]-QUA[6]

45

CLK
⇨

44    55    56    44    55    56

45

CLK
⇨

44    55    56    46_2

47    PD

PPD[2]

QUA[7]-QUA[9]

45

CLK
⇨

44    55    56    44    55    56

45

CLK
⇨

44    55    56    PPD[3]

46_3

Flip-flop
220

SEMICONDUCTOR DEVICE

CROSS REFERENCE TO RELATED APPLICATIONS

This application is a U.S. National Phase Application under 35 U.S.C. § 371 of International Application PCT/IB2021/052351, filed on Mar. 22, 2021, which is incorporated by reference and claims the benefit of a foreign priority application filed in Japan on Apr. 3, 2020, as Application No. 2020-067168.

TECHNICAL FIELD

In this specification, a semiconductor device and the like will be described.

Note that one embodiment of the present invention is not limited to the above technical field. Examples of the technical field of one embodiment of the present invention disclosed in this specification and the like include a semiconductor device, an imaging device, a display device, a light-emitting device, a power storage device, a memory device, a display system, an electronic device, a lighting device, an input device, an input/output device, a driving method thereof, and a manufacturing method thereof.

BACKGROUND ART

Electronic devices each including a semiconductor device including a CPU (Central Processing Unit) or the like have been widely used. In such electronic devices, techniques for improving the performance of the semiconductor devices have been actively developed to process a large volume of data at high speed. As a technique for achieving high performance, what is called an SoC (System on Chip) is given in which an accelerator such as a GPU (Graphics Processing Unit) and a CPU are tightly coupled. In the semiconductor device having higher performance by adopting an SoC, heat generation and an increase in power consumption become problems.

AI (Artificial Intelligence) technology requires a large amount of calculation and a large number of parameters and thus the amount of arithmetic operation is increased. An increase in the amount of arithmetic operation causes heat generation and an increase in power consumption; thus, architectures for reducing the amount of arithmetic operation have been actively proposed. Typical architectures are Binary Neural Network (BNN) and Ternary Neural Network (TNN), which are effective especially in reducing circuit scale and power consumption (see Patent Document 1, for example).

REFERENCE

Patent Document

[Patent Document 1] PCT International Publication No. 2019/078924

SUMMARY OF THE INVENTION

Problems to be Solved by the Invention

In AI technology, product-sum operation using weight data and input data is repeated an enormous number of times; thus, a large amount of weight data or intermediate data needs to be retained in a memory cell array. Furthermore, in AI technology, processing other than product-sum operation, such as activation operation or pooling operation, is generally performed in addition to product-sum operation. This might significantly increase the circuit area where a memory cell array and a dedicated arithmetic circuit are provided in the case where arithmetic operation using AI technology is performed with an integrated circuit.

AI technology requires higher arithmetic processing speed. In the case where arithmetic operation using AI technology is performed with an integrated circuit, weight data or intermediate data is read out to an arithmetic circuit through a bit line in a memory cell array. Weight data or intermediate data is read out at high frequency in a bit line. This increases charge and discharge energy of a bit line, which might increase power consumption.

Shortening a bit line is effective in reducing charge and discharge energy of the bit line. However, arithmetic circuits and memory cell arrays are alternately arranged, and thus the area of the peripheral circuits might increase greatly.

An object of one embodiment of the present invention is to provide a small semiconductor device. Another object of one embodiment of the present invention is to provide a semiconductor device with low power consumption. Another object of one embodiment of the present invention is to provide a semiconductor device with improved arithmetic processing speed. Another object is to provide a semiconductor device with a novel structure.

One embodiment of the present invention does not necessarily achieve all the above objects and only needs to achieve at least one of the objects. The description of the above objects does not preclude the existence of other objects. Objects other than these objects will be apparent from the description of the specification, the claims, the drawings, and the like, and objects other than these objects can be derived from the description of the specification, the claims, the drawings, and the like.

Means for Solving the Problems

One embodiment of the present invention is a semiconductor device including a plurality of memory circuits, a switching circuit, a first arithmetic circuit, and a second arithmetic circuit. The plurality of memory circuits each have a function of retaining weight data. The switching circuit has a function of switching electrical continuity and discontinuity between any one of the plurality of memory circuits and the first arithmetic circuit. The first arithmetic circuit outputs a first output signal based on product-sum operation processing of input data and the weight data selected by the switching circuit to the second arithmetic circuit. The plurality of memory circuits are provided in a layer stacked over a layer including the switching circuit, the first arithmetic circuit, and the second arithmetic circuit.

One embodiment of the present invention is a semiconductor device including a plurality of memory circuits, a switching circuit, a first arithmetic circuit, and a second arithmetic circuit. The plurality of memory circuits each have a function of retaining weight data. The switching circuit has a function of switching electrical continuity and discontinuity between any one of the plurality of memory circuits and the first arithmetic circuit. The first arithmetic circuit outputs a first output signal based on product-sum operation processing of input data and the weight data selected by the switching circuit to the second arithmetic circuit. The second arithmetic circuit has a function of performing activation function operation processing, quantization operation processing, and first pooling operation processing. The plurality of memory circuits are provided in a layer stacked over a layer including the switching circuit, the first arithmetic circuit, and the second arithmetic circuit.

One embodiment of the present invention is preferably a semiconductor device which includes a plurality of memory circuits, a switching circuit, a first arithmetic circuit, a second arithmetic circuit, and a third arithmetic circuit and in which the plurality of memory circuits each have a function of retaining weight data, the switching circuit has a function of switching electrical continuity and disconti- nuity between any one of the plurality of memory circuits and the first arithmetic circuit, the first arithmetic circuit outputs a first output signal based on product-sum operation processing of input data and the weight data selected by the switching circuit to the second arithmetic circuit, the second arithmetic circuit has a function of performing activation function operation processing, quantization operation pro- cessing, and first pooling operation processing, the third arithmetic circuit has a function of performing second pooling operation processing of a second output signal output from the second arithmetic circuit, and the plurality of memory circuits are provided in a layer stacked over a layer including the switching circuit, the first arithmetic circuit, and the second arithmetic circuit.

In the semiconductor device of one embodiment of the present invention, it is preferable that the memory circuits each include a first transistor and the first transistor include a semiconductor layer including a metal oxide in a channel formation region.

In the semiconductor device of one embodiment of the present invention, the metal oxide contains In, Ga, and Zn.

In the semiconductor device of one embodiment of the present invention, the switching circuit, the first arithmetic circuit, and the second arithmetic circuit each include a second transistor, and the second transistor includes a semi- conductor layer containing silicon in a channel formation region.

Note that other embodiments of the present invention will be shown in the description of the following embodiments and the drawings.

Effect of the Invention

One embodiment of the present invention can provide a small semiconductor device. Furthermore, one embodiment of the present invention can provide a semiconductor device with low power consumption. One embodiment of the present invention can provide a semiconductor device with improved arithmetic processing speed. A semiconductor device with a novel structure can be provided.

The description of a plurality of effects does not preclude the existence of other effects. In addition, one embodiment of the present invention does not necessarily achieve all the effects described as examples. In one embodiment of the present invention, other objects, effects, and novel features are apparent from the description of this specification and the drawings.

BRIEF DESCRIPTION OF THE DRAWINGS

FIG. 6A, FIG. 6B, and FIG. 6C are diagrams illustrating structure examples of semiconductor devices.

FIG. 9A and FIG. 9B are diagrams each illustrating a structure example of a semiconductor device.

FIG. 25A and FIG. 25B are diagrams illustrating an application example of an integrated circuit.

ODE FOR CARRYING OUT THE INVENTION

Figures 1A, 1B:
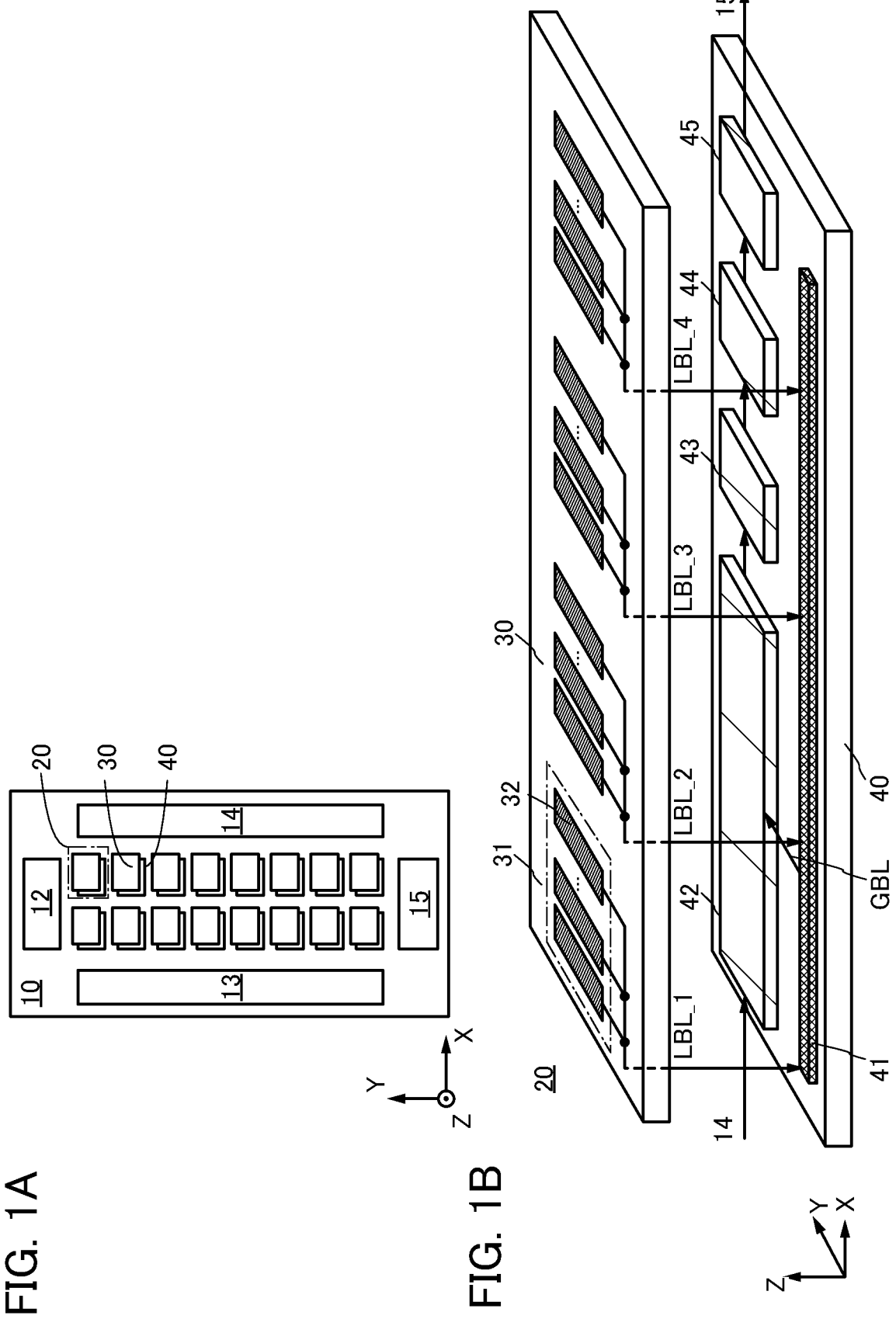
FIG. 1A and FIG. 1B are diagrams illustrating a structure example of a semiconductor device.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention there- fore should not be construed as being limited to the follow- ing description of the embodiments.

Note that ordinal numbers such as "first", "second", and "third" in this specification and the like are used in order to avoid confusion among components. Thus, the terms do not limit the number of components. Furthermore, the terms do not limit the order of components. In this specification and the like, for example, a "first" component in one embodi- ment can be referred to as a "second" component in other embodiments or claims. For another example, a "first" component in one embodiment in this specification and the like can be omitted in other embodiments or claims.

The same components, components having similar functions, components made of the same material, components formed at the same time, and the like in the drawings are denoted by the same reference numerals, and repeated description thereof is skipped in some cases.

In this specification, for example, a power supply potential VDD may be abbreviated to a potential VDD, VDD, or the like. The same applies to other components (e.g., a signal, a voltage, a circuit, an element, an electrode, and a wiring).

In the case where a plurality of components are denoted by the same reference numerals, and, particularly when they need to be distinguished from each other, an identification sign such as "_1", "_2", "[n]", or "[m,n]" is sometimes added to the reference numerals. For example, a second wiring GL is referred to as a wiring GL[2].

Embodiment 1

The structure, operation, and the like of a semiconductor device of one embodiment of the present invention will be described.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

FIG. 1A is a diagram illustrating a semiconductor device 10 of one embodiment of the present invention. FIG. 1B is a diagram illustrating a structure example of an arithmetic operation block included in the semiconductor device 10.

The semiconductor device 10 has a function of an accelerator that executes a program (also referred to as kernel or a kernel program) called from a host program. The semiconductor device 10 can perform parallel processing of matrix operation in graphics processing, parallel processing of product-sum operation of a neural network, and parallel processing of floating-point operation in a scientific computation, for example.

The semiconductor device 10 includes a plurality of arithmetic operation blocks 20 as illustrated in FIG. 1A. The arithmetic operation blocks 20 each include a memory circuit portion 30 (also referred to as a memory cell array) and an arithmetic circuit portion 40. As illustrated in FIG. 1A and FIG. 1B, the memory circuit portion 30 and the arithmetic circuit portion 40 are provided in different layers in the direction substantially perpendicular to the xy plane in the diagram (in the z direction in FIG. 1A). That is, the memory circuit portion 30 and the arithmetic circuit portion 40 are provided to be stacked.

Note that "substantially perpendicular" refers to a state where an arrangement angle is greater than or equal to 85° and less than or equal to 95°. Note that in this specification, the X direction, the Y direction, and the Z direction illustrated in FIG. 1B or the like are directions orthogonal to or intersecting with each other. Here, it is preferable that the X direction and the Y direction be parallel or substantially parallel to the substrate surface and the Z direction be perpendicular or substantially perpendicular to the substrate surface.

The memory circuit portion 30 includes a plurality of circuit blocks 31. The circuit blocks 31 each include a plurality of memory circuits 32. Writing and reading out of data to and from the memory circuits 32 are controlled by a driver circuit 12 and a driver circuit 13. The driver circuit 12 and the driver circuit 13 are each also referred to as a data control circuit.

Data stored in each of the memory circuits 32 is data (weight data) that corresponds to a weight parameter used for product-sum operation of a neural network. When the weight data is digital data, the semiconductor device can be highly resistant to noise and is capable of performing arithmetic operation at high speed. Alternatively, the weight data may be analog data.

The memory circuits 32 included in the circuit blocks 31 in a layer including the memory circuit portion 30 are connected to a switching circuit 41 included in the arithmetic circuit portion 40 through wirings LBL_1 to LBL_4 (also referred to as local bit lines or read bit lines) illustrated as an example. The memory circuits 32 included in the memory circuit portion 30 each include a transistor including an oxide semiconductor in its channel formation region (an OS transistor).

A layer including the arithmetic circuit portion 40 includes the switching circuit 41, a product-sum operation circuit 42, and dedicated arithmetic circuits such as an activation function operation circuit 43, a quantization operation circuit 44, and a pre-pooling operation circuit 45. The control and processing of data input and output and the like in the arithmetic circuit portion 40 are controlled by a control circuit 14 and a processing circuit 15. The control circuit 14 and the processing circuit 15 are also referred to as arithmetic control circuits, arithmetic processing circuits, or arithmetic circuits.

The switching circuit 41 has a function of selecting the potentials of the wirings LBL_1 to LBL_4 that extend from the plurality of circuit blocks 31, and transmitting the potentials to a wiring GBL (also referred to as a global bit line). The switching circuit 41 can be, for example, a three-state buffer in which the state of the output potential is controlled by a control signal. Note that the switching circuit 41 is preferably formed using transistors containing silicon in their channel formation regions (Si transistors). Such a structure enables high-speed switching of the connection state.

Note that the wirings LBL_1 to LBL_4 (wirings LBL) are wirings for transmitting weight data from the memory circuit portion 30 to the arithmetic circuit portion 40. To read out weight data from the memory circuit portion 30 to the wirings LBL at high speed, it is preferable to shorten the wirings LBL. Furthermore, to reduce energy consumption caused by charge and discharge, it is preferable to shorten the wirings LBL. In other words, the switching circuit 41 is preferably provided to be close to the wirings LBL extending in the z direction (an arrow extending in the z direction in the diagram). When the physical distance between the arithmetic circuit portion 40 and the memory circuit portion 30 is decreased, for example, a wiring distance can be shortened by stacking layers, parasitic capacitance generated in a signal line can be reduced and low power consumption can be achieved.

The product-sum operation circuit 42 has a function of executing arithmetic processing such as product-sum operation. The product-sum operation circuit 42 is sometimes simply referred to as an arithmetic circuit or a first arithmetic circuit. The product-sum operation circuit 42 performs product-sum operation of input data input from the control circuit 14 and weight data supplied to the wiring GBL. The input data and the weight data are preferably digital data. Digital data is unlikely to be affected by noise. Thus, the product-sum operation circuit 42 is suitable for performing arithmetic processing that requires a highly accurate arithmetic operation result. Note that the product-sum operation circuit 42 is preferably formed using a Si transistor.

The activation function operation circuit 43 has a function of performing processing, which is based on an activation function, on the data obtained through the product-sum operation. As the activation function, for example, a sigmoid function, a tanh function, a softmax function, a ReLU (Rectified Linear Unit) function, a threshold function, or the like can be used. A ReLU function is a function that outputs "0" when an input value is negative and outputs the input value as it is when the input value is greater than or equal to "0". Note that the activation function operation circuit 43 is preferably formed using a Si transistor.

The quantization operation circuit 44 has a function of performing quantization operation processing in which the bit width of input data is reduced to reduce the amount of arithmetic operation in the subsequent stage. In product-sum operation, the bit width increases with repetition of arithmetic processing. Thus, in the quantization operation circuit 44, input data is subjected to bit shift to round off data positioned at the decimal point, so that the bit width is reduced. Note that the quantization operation circuit 44 is preferably formed using a Si transistor.

The pre-pooling operation circuit 45 has a function of performing arithmetic operation of part of pooling operation processing. In the case of 3×3 pooling, for example, arithmetic operation using some values of a 3×3 region instead of using all the values is sometimes referred to as pre-pooling, pre-pooling operation processing, or first pooling operation processing. Since pre-pooling operation processing is arithmetic processing in which part of pooling operation processing is performed, pre-pooling operation processing is sometimes referred to as partial pooling operation processing or first partial pooling operation processing. The pre-pooling operation circuit 45 corresponds to a circuit that extracts the largest value of some regions, e.g., one-dimensional data, as output data of the pre-pooling operation circuit 45 in max pooling, for example. Note that the pre-pooling operation circuit 45 is preferably formed using a Si transistor.

The output data obtained in the pre-pooling operation circuit 45 is output to the processing circuit 15. When arithmetic processing is performed in a post-pooling operation circuit in the processing circuit 15, for example, the data can be regarded as being subjected to arithmetic processing equivalent to pooling operation processing. In the case of 3×3 pooling, for example, pooling operation processing corresponding to 3×3 pooling, which is performed using data obtained through pre-pooling operation processing using the values of a 3×1 region, is sometimes referred to as post-pooling, post-pooling operation processing, or second pooling operation processing. Since post-pooling operation processing is arithmetic processing in which part of pooling operation processing is performed, post-pooling operation processing is sometimes referred to as partial pooling operation processing or second partial pooling operation processing. The processing circuit including the post-pooling operation circuit is sometimes referred to as an arithmetic circuit or a third arithmetic circuit. Specific examples of arithmetic processing in the pre-pooling operation circuit and the post-pooling operation circuit will be described later.

When formed using Si transistors, the switching circuit 41, the product-sum operation circuit 42, and the dedicated arithmetic circuits such as the activation function operation circuit 43, the quantization operation circuit 44, and the pre-pooling operation circuit 45 can be provided to be stacked with OS transistors. That is, the memory circuit portion 30 formed using OS transistors can be provided to be stacked with the arithmetic circuit portion 40 that can be formed using Si transistors. Accordingly, the area where the memory circuit portion 30 can be provided can be increased without an increase in the circuit area. When a region where the memory circuit portion 30 is provided is over a substrate provided with the arithmetic circuit portion 40, storage capacity, which is necessary for arithmetic processing in the semiconductor device 10 functioning as an accelerator, can be increased as compared with that in the case where the memory circuit portion 30 is provided in the same layer as the arithmetic circuit portion 40. With increased storage capacity, the number of times of data transfer from an external memory device to the semiconductor device, which is necessary for arithmetic processing, can be reduced, whereby the power consumption can be reduced.

The memory circuits 32 included in the memory circuit portion 30 can have a circuit structure of a NOSRAM. "NOSRAM (registered trademark)" is an abbreviation for "Nonvolatile Oxide Semiconductor RAM". A NOSRAM is a memory in which its memory cell is a 2-transistor (2T) or 3-transistor (3T) gain cell, and its access transistor is an OS transistor.

An OS transistor has an extremely low current that flows between a source and a drain in an off state, that is, leakage current. The NOSRAM can be used as a nonvolatile memory by retaining electric charge corresponding to data in the memory circuit, using characteristics of an extremely low leakage current. In particular, the NOSRAM is capable of reading out retained data without destruction (non-destructive reading), and thus is suitable for parallel processing of product-sum operation of a neural network in which data reading operation is repeated many times.

The memory circuit 32 is preferably a memory including an OS transistor (hereinafter, also referred to as an OS memory), such as a NOSRAM or a DOSRAM. A metal oxide functioning as an oxide semiconductor has a band gap of 2.5 eV or wider; thus, an OS transistor has an extremely low off-state current. For example, the off-state current per micrometer in channel width at a source-drain voltage of 3.5 V and room temperature (25° C.) can be lower than $1 \times 10^{-20}$ A, lower than $1 \times 10^{-22}$ A, or lower than $1 \times 10^{-24}$ A. Therefore, in an OS memory, the amount of electric charge that leaks from a retention node through the OS transistor is extremely small. Accordingly, the OS memory can function as a nonvolatile memory circuit; thus, power gating of the semiconductor device 10 is enabled.

A semiconductor device with transistors integrated at high density generates heat due to circuit drive in some cases. This heat makes the temperature of a transistor rise to change the characteristics of the transistor, and the field-effect mobility thereof might change or the operation frequency thereof might decrease, for example. Since an OS transistor has a higher heat resistance than a Si transistor, a change in field-effect mobility and a decrease in operating frequency due to a temperature change do not easily occur. Even when having a high temperature, an OS transistor is likely to keep a property of the drain current increasing exponentially with respect to the gate-source voltage. Thus, the use of an OS transistor enables stable operation in a high-temperature environment.

A metal oxide used for an OS transistor is a Zn oxide, a Zn—Sn oxide, a Ga—Sn oxide, an In—Ga oxide, an In—Zn oxide, an In-M-Zn oxide (M is Ti, Ga, Y, Zr, La, Ce, Nd, Sn, or Hf), or the like. The use of a metal oxide containing Ga as M for the OS transistor is particularly preferable because the electrical characteristics such as field-effect mobility of the transistor can be made excellent by adjusting a ratio of elements. In addition, an oxide containing indium and zinc may contain one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

In order to improve the reliability and electrical characteristics of the OS transistor, it is preferable that the metal oxide used in the semiconductor layer be a metal oxide having a crystal portion such as CAAC-OS, CAC-OS, or nc-OS. CAAC-OS is an abbreviation for c-axis-aligned crystalline oxide semiconductor. CAC-OS is an abbreviation for Cloud-Aligned Composite oxide semiconductor. In addition, nc-OS is an abbreviation for nanocrystalline oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The CAC-OS has a function of allowing electrons (or holes) serving as carriers to flow and a function of not allowing electrons serving as carriers to flow. The function of allowing electrons to flow and the function of not allowing electrons to flow are separated, whereby both functions can be heightened to the maximum. In other words, when CAC-OS is used for a channel formation region of an OS transistor, a high on-state current and an extremely low off-state current can be both achieved.

Avalanche breakdown or the like is less likely to occur in some cases in an OS transistor than in a general Si transistor because, for example, a metal oxide has a wide band gap and thus electrons are less likely to be excited, and the effective mass of a hole is large. Therefore, for example, it may be possible to inhibit hot-carrier degradation or the like that is caused by avalanche breakdown. Since hot-carrier degradation can be inhibited, an OS transistor can be driven with a high drain voltage.

An OS transistor is an accumulation transistor in which electrons are majority carriers. Therefore, DIBL (Drain-Induced Barrier Lowering), which is one of short-channel effects, affects an OS transistor less than an inversion transistor having a pn junction (typically a Si transistor). In other words, an OS transistor has higher resistance against short-channel effects than a Si transistor.

Owing to its high resistance against short-channel effects, an OS transistor can have a reduced channel length without deterioration in reliability, which means that the use of an OS transistor can increase the degree of integration in a circuit. Although a reduction in channel length enhances a drain electric field, avalanche breakdown is less likely to occur in an OS transistor than in a Si transistor as described above.

Since an OS transistor has a high resistance against short-channel effects, a gate insulating film can be made thicker than that of a Si transistor. For example, even in a minute transistor whose channel length and channel width are less than or equal to 50 nm, a gate insulating film as thick as approximately 10 nm can be provided in some cases. When the gate insulating film is made thick, parasitic capacitance can be reduced and thus the operating speed of a circuit can be improved. In addition, when the gate insulating film is made thick, leakage current through the gate insulating film is reduced, resulting in a reduction in static current consumption.

As described above, the semiconductor device 10 can retain data owing to the memory circuits 32 that are OS memories even when supply of power supply voltage is stopped. Thus, the power gating of the semiconductor device 10 is enabled and power consumption can be reduced greatly.

Next, a block diagram illustrating the whole of an arithmetic processing system 100 including the semiconductor device 10 functioning as an AI accelerator is described with reference to FIG. 2.

Figure 2:
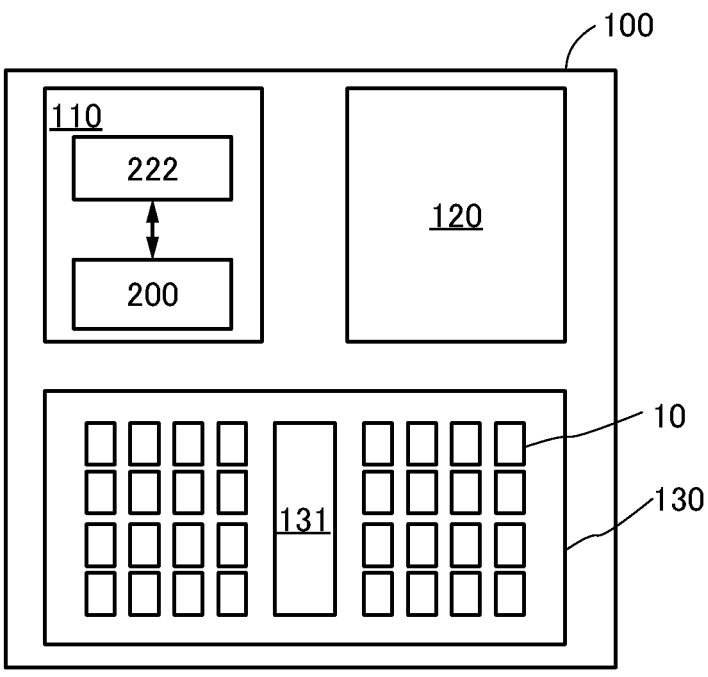
FIG. 2 is a diagram illustrating a structure example of a semiconductor device.

FIG. 2 illustrates a CPU 110 and a bus 120 as well as an accelerator portion 130 including a plurality of semiconductor devices 10 illustrated in FIG. 1A and FIG. 1B. The CPU 110 includes a CPU core 200 and a backup circuit 222. The accelerator portion 130 includes, in addition to the plurality of semiconductor devices 10, a control portion 131 for controlling the input and output of data between the semiconductor devices 10.

The CPU 110 has a function of performing general-purpose processing such as execution of an operating system, control of data, and execution of various kinds of arithmetic operation and programs. The CPU 110 includes the CPU core 200. The CPU core 200 corresponds to one or a plurality of CPU cores. The CPU 110 includes the backup circuit 222 that can retain data stored in the CPU core 200 even when the supply of power supply voltage is stopped. The supply of power supply voltage can be controlled by electric isolation by a power switch or the like from a power domain. Note that power supply voltage is referred to as drive voltage in some cases. As the backup circuit 222, for example, an OS memory including OS transistors is suitable.

The backup circuit 222 formed using OS transistors can be provided to be stacked with the CPU core 200 that can be formed using Si transistors. The area of the backup circuit 222 is smaller than that of the CPU core 200; thus, the circuit area is not increased when the backup circuit 222 is provided over the CPU core 200. The backup circuit 222 has a function of retaining data of a register included in the CPU core 200. The backup circuit 222 is also referred to as a data retention circuit. Note that a structure of the CPU core 200 provided with the backup circuit 222 including OS transistors will be described in detail in Embodiment 3.

The control portion 131 includes a memory circuit such as an SRAM therein. The control portion 131 retains, in the memory circuit, output data obtained in the plurality of semiconductor devices 10. Then, the output data MAC retained in the memory circuit is output to the plurality of semiconductor devices. With such a structure, it is possible to perform parallel computation with an increased number of parallel processes using the plurality of semiconductor devices.

The bus 120 electrically connects the CPU 110 and the accelerator portion 130. That is, data transmission can be performed between the CPU 110 and the semiconductor device 10 through the bus 120.

Figure 3:
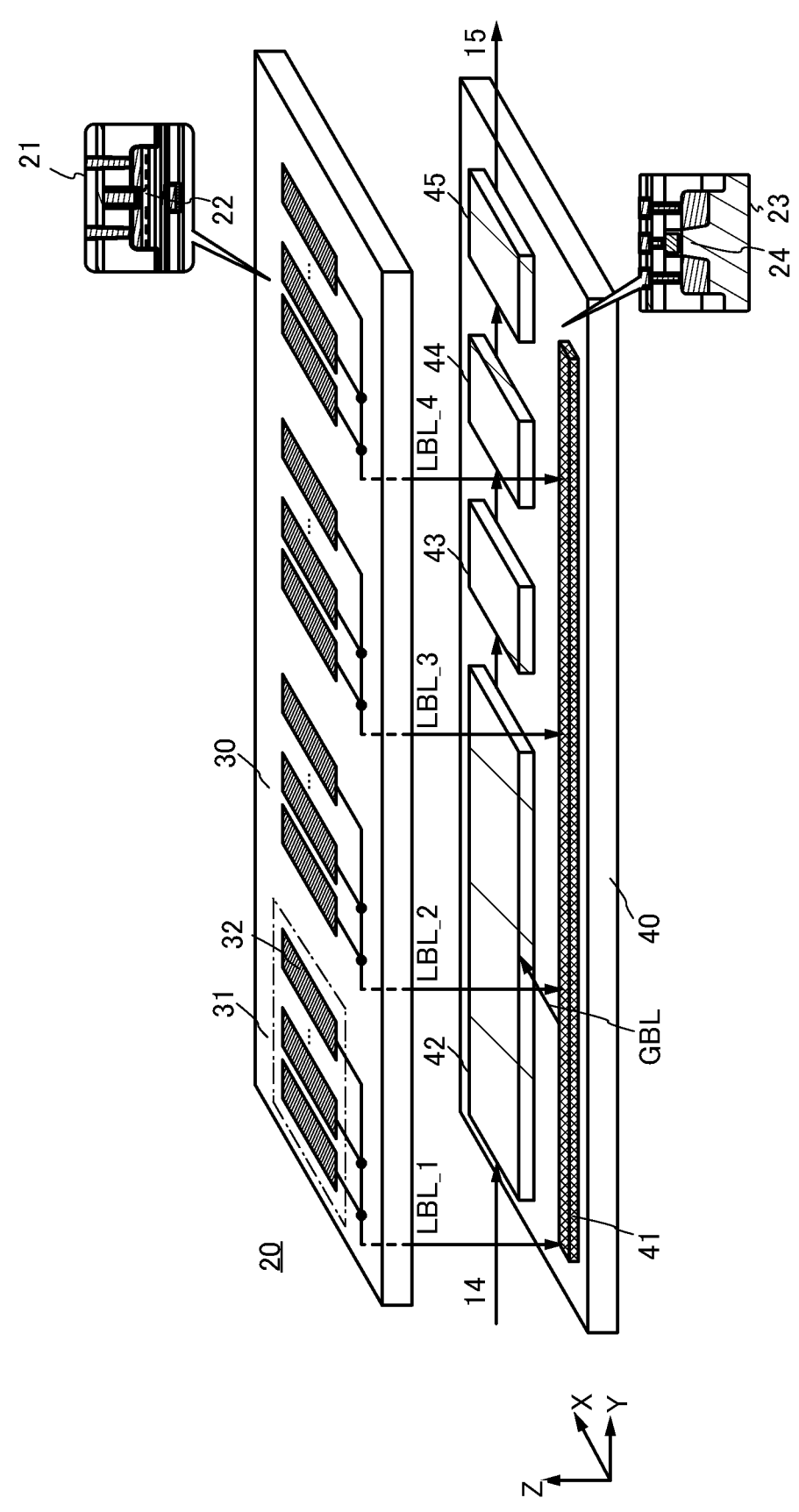
FIG. 3 is a diagram illustrating a structure example of a semiconductor device.

FIG. 3 is a diagram illustrating a transistor suitable for the memory circuit portion 30 and the arithmetic circuit portion 40 in the arithmetic operation block 20 illustrated in FIG. 1B.

The memory circuit portion 30 includes the memory circuits 32. The memory circuits 32 each include a transistor 21. When a semiconductor layer 22 included in the transistor 21 is an oxide semiconductor (metal oxide), the memory circuits 32 including the OS transistors can be obtained.

The arithmetic circuit portion 40 includes the switching circuit 41, the product-sum operation circuit 42, and the dedicated arithmetic circuits such as the activation function operation circuit 43, the quantization operation circuit 44, and the pre-pooling operation circuit 45. The circuits included in the arithmetic circuit portion 40 each include a transistor 23. When a semiconductor layer 24 included in the transistor 23 is silicon, the circuits included in the arithmetic circuit portion 40 formed using the Si transistors can be obtained.

When the region where the memory circuit portion 30 is provided is over the substrate provided with the arithmetic circuit portion 40, storage capacity, which is necessary for arithmetic processing in the semiconductor device 10 functioning as an accelerator, i.e., the number of memory circuits, can be increased as compared with that in the case where the memory circuit portion 30 is provided in the same layer as the arithmetic circuit portion 40. With increased storage capacity, the number of times of data transfer from an external memory device to the semiconductor device, which is necessary for arithmetic processing, can be reduced, whereby the power consumption can be reduced.

Figures 4A, 4B:
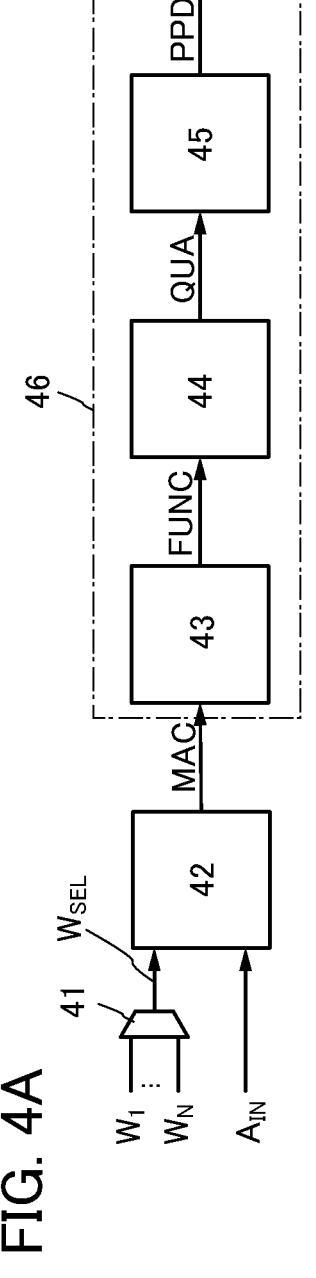
FIG. 4A and FIG. 4B are diagrams illustrating a structure example of a semiconductor device.

FIG. 4A is a block diagram illustrating input and output of data in the circuits in the semiconductor device 10 of one embodiment of the present invention. FIG. 4A illustrates the switching circuit 41, the product-sum operation circuit 42, and the dedicated arithmetic circuits such as the activation function operation circuit 43, the quantization operation circuit 44, and the pre-pooling operation circuit 45.

The switching circuit 41 has a function of switching electrical continuity and discontinuity between one of the memory circuits 32 and the product-sum operation circuit 42. For example, the switching circuit 41 selects weight data $W_1$ to $W_N$ (N is a natural number greater than or equal to 2) output to the wiring GBL from the data retained in the memory circuits 32 in the circuit blocks 31 of the memory circuit portion 30. The switching circuit 41 outputs the selected weight data as weight data $W_{SEL}$ to the product-sum operation circuit 42 through the wiring GBL.

The product-sum operation circuit 42 outputs, to a dedicated arithmetic circuit 46, data (output signal) based on product-sum operation processing of input data and the weight data selected by the switching circuit 41. For example, the product-sum operation circuit 42 performs product-sum operation based on the weight data $W_{SEL}$ and input data $A_{IN}$ input from the control circuit 14. The data MAC obtained through the product-sum operation is output to the activation function operation circuit 43 in the dedicated arithmetic circuit 46.

The dedicated arithmetic circuit 46 is a circuit for performing product-sum operation processing in a neural network used for convolutional operation, e.g., arithmetic processing based on an activation function, arithmetic processing for quantization, arithmetic processing for pooling operation processing, or arithmetic processing for normalization. The dedicated arithmetic circuit 46 is sometimes referred to as an arithmetic circuit or a second arithmetic circuit. Although a structure in which the dedicated arithmetic circuit 46 includes the activation function operation circuit 43, the quantization operation circuit 44, and the pre-pooling operation circuit 45 is illustrated as an example, the dedicated arithmetic circuit 46 may include another component.

The activation function operation circuit 43 is a circuit for performing arithmetic processing based on an activation function on the input data MAC and outputting data FUNC obtained through the arithmetic processing based on the activation function. The data FUNC is output to the quantization operation circuit 44 in the dedicated arithmetic circuit 46.

The quantization operation circuit 44 is a circuit for performing quantization operation processing on the input data FUNC and outputting data QUA. In quantization operation processing, input data is subjected to bit shift and data positioned at the decimal point is rounded off in order to adjust the bit width of the input data. The data QUA is output to the pre-pooling operation circuit 45 in the dedicated arithmetic circuit 46.

The pre-pooling operation circuit 45 is a circuit for performing part of pooling operation processing on the input data QUA and outputting data PPD obtained through pre-pooling operation processing. When including the pre-pooling operation circuit 45, the dedicated arithmetic circuit 46 can perform part of pooling operation processing. As illustrated in FIG. 4B, the data PPD is output to a post-pooling operation circuit 47 included in the processing circuit 15. Note that the processing circuit 15 including the post-pooling operation circuit 47 is sometimes referred to as an arithmetic circuit or a third arithmetic circuit.

The post-pooling operation circuit 47 is a circuit for performing arithmetic processing on the input data PPD and outputting data PD obtained by performing pooling operation processing on the data QUA. When including the post-pooling operation circuit 47, the processing circuit 15 can have a smaller area than that performing the whole arithmetic processing of pooling operation processing. The data PD is used as the input data $A_{IN}$ in the control circuit 14.

Figure 5A:
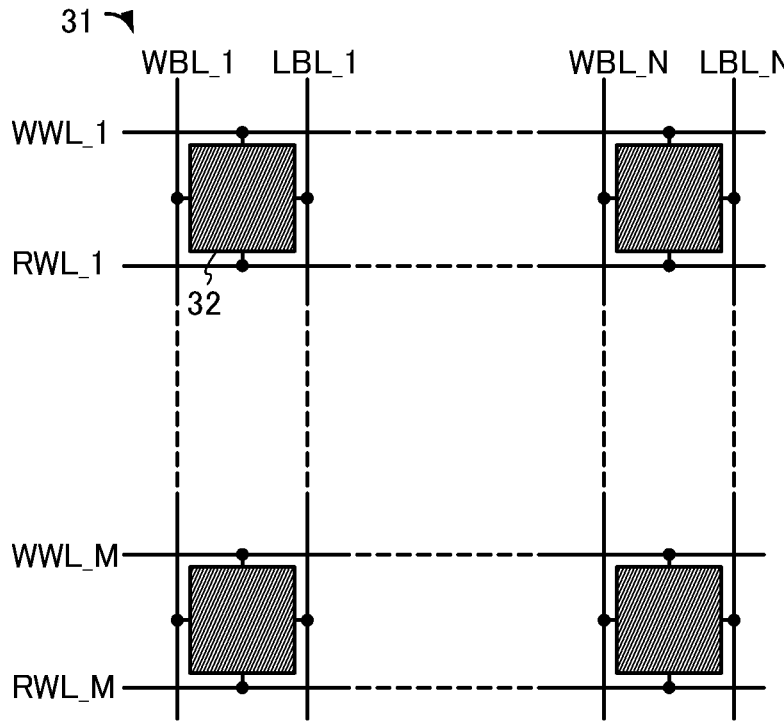
FIG. 5A and FIG. 5B are diagrams illustrating a structure example of a semiconductor device.

FIG. 5A is a diagram illustrating a circuit structure example applicable to the circuit block 31 included in the memory circuit portion 30 in the semiconductor device 10 of the present invention. FIG. 5A illustrates write word lines WWL_1 to WWL_M, read word lines RWL_1 to RWL_M, write bit lines WBL_1 to WBL_N, and the wirings LBL_1 to LBL_N, which are arranged in a matrix of M rows and N columns (M and N are each a natural number greater than or equal to 2). The memory circuits 32 connected to the word lines and the bit lines are also illustrated.

Figure 5B:
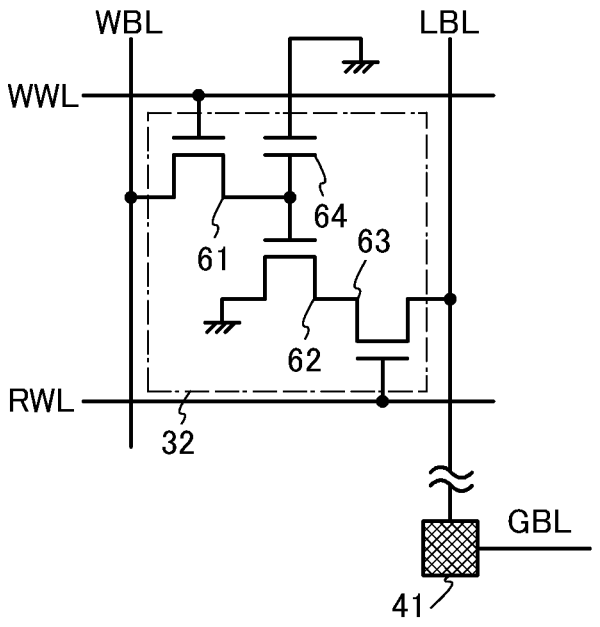

FIG. 5B is a diagram illustrating a circuit structure example applicable to the memory circuit 32. The memory circuit 32 includes a transistor 61, a transistor 62, a transistor 63, and a capacitor 64.

One of a source and a drain of the transistor 61 is connected to the write bit line WBL. A gate of the transistor 61 is connected to the write word line WWL. The other of the source and the drain of the transistor 61 is connected to one electrode of the capacitor 64 and a gate of the transistor 62. One of a source and a drain of the transistor 62 and the other electrode of the capacitor 64 are connected to a wiring supplying a fixed potential such as a ground potential. The other of the source and the drain of the transistor 62 is connected to one of a source and a drain of the transistor 63. A gate of the transistor 63 is connected to the read word line RWL. The other of the source and the drain of the transistor 63 is connected to the wiring LBL. The wiring LBL is connected to the wiring GBL through the switching circuit 41. The wiring LBL is connected to the switching circuit 41 through the wiring provided to extend in the direction substantially perpendicular to the surface of the substrate provided with the Si transistors in the arithmetic circuit portion 40.

The circuit structure of the memory circuit 32 illustrated in FIG. 5B corresponds to a NOSRAM of a 3-transistor (3T) gain cell. The transistor 61 to the transistor 63 are OS transistors. An OS transistor has an extremely low current that flows between a source and a drain in an off state, that is, leakage current. The NOSRAM can be used as a non-volatile memory by retaining electric charge corresponding to data in the memory circuit, using characteristics of an extremely low leakage current.

Figures 6A, 6B, 6C:
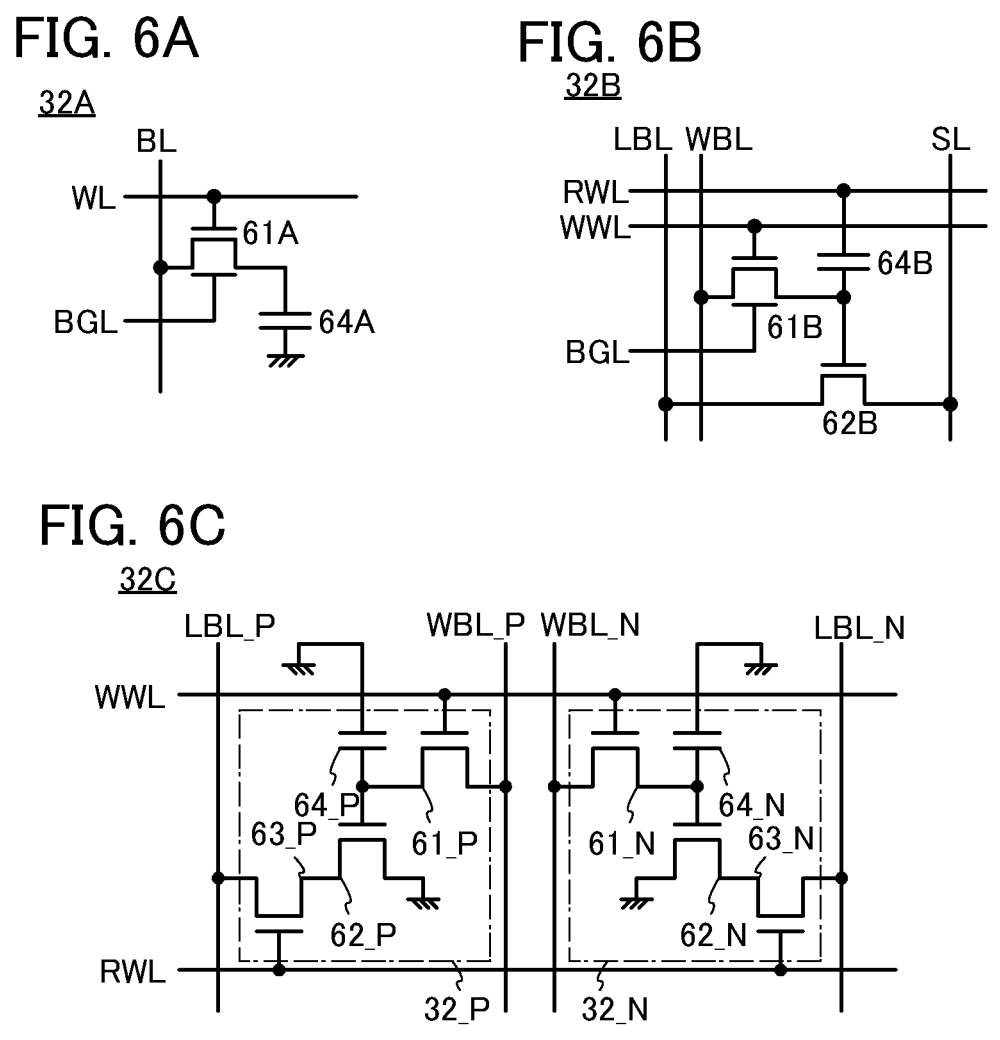

The circuit structure applicable to the memory circuit 32 in FIG. 5A is not limited to a 3T NOSRAM in FIG. 5B. For example, a circuit corresponding to a DOSRAM illustrated in FIG. 6A may be employed. FIG. 6A illustrates a memory circuit 32A including a transistor 61A and a capacitor 64A. The transistor 61A is an OS transistor. An example is illustrated in which the memory circuit 32A is connected to a bit line BL, a word line WL, and a back gate line BGL.

The circuit structure applicable to the memory circuit 32 in FIG. 5A may be a circuit corresponding to a 2T NOSRAM illustrated in FIG. 6B. FIG. 6B illustrates a memory circuit 32B including a transistor 61B, a transistor 62B, and a capacitor 64B. The transistor 61B and the transistor 62B are OS transistors. The transistor 61B and the transistor 62B may be OS transistors whose semiconductor layers are provided in different layers or may be OS transistors whose semiconductor layers are provided in the same layer. An example is illustrated in which the memory circuit 32B is connected to the write bit line WBL, the wiring LBL functioning as a read bit line, the write word line WWL, the read word line RWL, a source line SL, and the back gate line BGL.

The circuit structure applicable to the memory circuit 32 in FIG. 5A may be a circuit combined with a 3T NOSRAM illustrated in FIG. 6C. FIG. 6C illustrates a memory circuit 32C including a memory circuit 32_P and a memory circuit 32_N that can retain data with different kinds of logic. FIG. 6C illustrates the memory circuit 32_P including a transistor 61_P, a transistor 62_P, a transistor 63_P, and a capacitor 64_P and the memory circuit 32_N including a transistor 61_N, a transistor 62_N, a transistor 63_N, and a capacitor 64_N. The transistors included in the memory circuit 32_P and the memory circuit 32_N are OS transistors. The transistors included in the memory circuit 32_P and the memory circuit 32_N may be OS transistors whose semiconductor layers are provided in different layers or may be OS transistors whose semiconductor layers are provided in the same layer. An example is illustrated in which the memory circuit 32C is connected to a write bit line WBL_P, a wiring LBL_P, a write bit line WBL_N, a wiring LBL_N, the write word line WWL, and the read word line RWL. The memory circuit 32C can retain data with different kinds of logic and read out the data with different kinds of logic to the wiring LBL_P and the wiring LBL_N.

Note that in the structure of FIG. 6C, an exclusive OR circuit (an XOR circuit) may be provided so that data corresponding to multiplication of data retained in the memory circuit 32_P and the memory circuit 32_N can be output to the wiring LBL. This structure makes it possible to omit arithmetic operation corresponding to multiplication in the product-sum operation circuit 42, whereby a reduction in power consumption can be achieved.

Figure 7A:
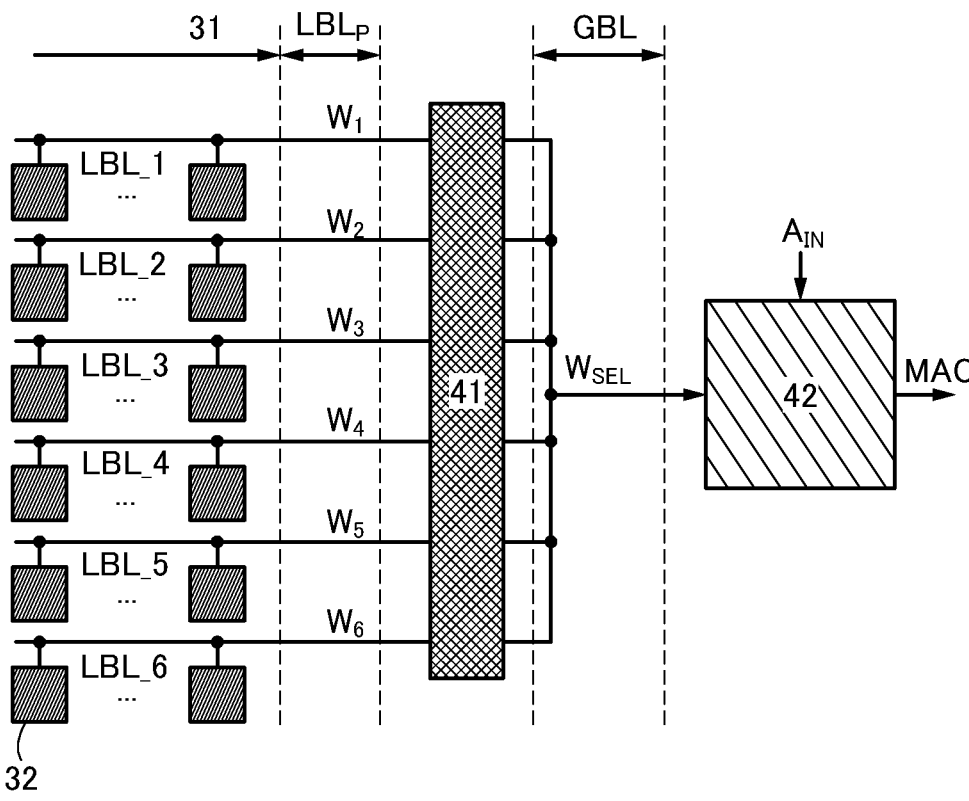
FIG. 7A and FIG. 7B are diagrams illustrating a structure example of a semiconductor device.

FIG. 7A is a diagram illustrating the switching circuit 41. FIG. 7A illustrates the case where the weight data $W_1$ to $W_6$ are read out from the memory circuits 32 in the circuit block 31 to the wirings LBL_1 to LBL_6. In addition, weight data that is selected from the weight data $W_1$ to $W_6$ by the switching circuit 41 and supplied to the wiring GBL is referred to as the weight data $W_{SEL}$. The description will be made on the assumption that the input data $A_{IN}$ is supplied to the product-sum operation circuit 42 to obtain the data MAC corresponding to product-sum operation data.

Wirings $LBL_P$ of the wirings LBL_1 to LBL_6, which connect the upper layer and the lower layer and extend in the vertical direction are shorter than wirings extending in the horizontal direction. Thus, the parasitic capacitance of the wirings LBL_1 to LBL_6 can be made small, so that electric charge needed for charge and discharge of the wirings can be reduced and a reduction in power consumption and an improvement in arithmetic efficiency can be achieved. Moreover, reading from the memory circuits 32 to the wirings LBL_1 to LBL_6 can be performed at high speed.

Arithmetic processing using the weight data $W_{SEL}$ through the wiring GBL can be performed in the product-sum operation circuit 42. The weight data $W_{SEL}$ can be supplied to a plurality of product-sum operation circuits 42 through the wiring GBL. This structure is suitable for arithmetic processing of a convolutional neural network in which arithmetic processing is performed using the same weight data.

Figure 7B:
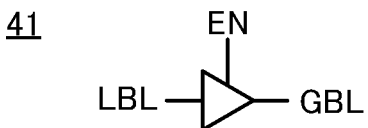

FIG. 7B is an example of a circuit structure applicable to the switching circuit 41 illustrated in FIG. 7A. A three-state buffer illustrated in FIG. 7B has a function of amplifying the potential of the wiring LBL and transferring it to the wiring GBL in response to a control signal EN. The switching circuit 41 can be regarded as a multiplexer. The switching circuit 41 has a function of selecting one of a plurality of input signals.

Note that although FIG. 7A illustrates a structure in which the switching circuit 41 selects one wiring from the plurality of wirings LBL and supplies the weight data $W_{SEL}$ to the wiring GBL, another structure may be employed. For example, a plurality of switching circuits may be provided as the switching circuit. Although each of the memory circuits 32 retains 1-bit data (i.e., data of '1' or '0') and arithmetic processing is performed using the data in FIG. 7A, one embodiment of the present invention is also applicable to a structure in which arithmetic processing is performed using multi-bit data. In the case of multi-bit (e.g., n-bit) data, multi-bit weight data to be supplied to the wiring GBL is selected using the switching circuit 41 connected to the wirings LBL_1 to LBL_n the number of which depends on the number of bits.

When the memory circuit portion 30 is included in a chip different from that of the arithmetic circuit portion 40, the bus width is limited depending on the number of pins of the chips. By contrast, in the structure in which the memory circuit portion 30 and the arithmetic circuit portion 40 are stacked as in the structure of one embodiment of the present invention, the number of pieces of data in parallel necessary for arithmetic processing can be increased in accordance with openings in which the wirings LBL are provided, so that efficient arithmetic processing can be performed.

Figure 8:
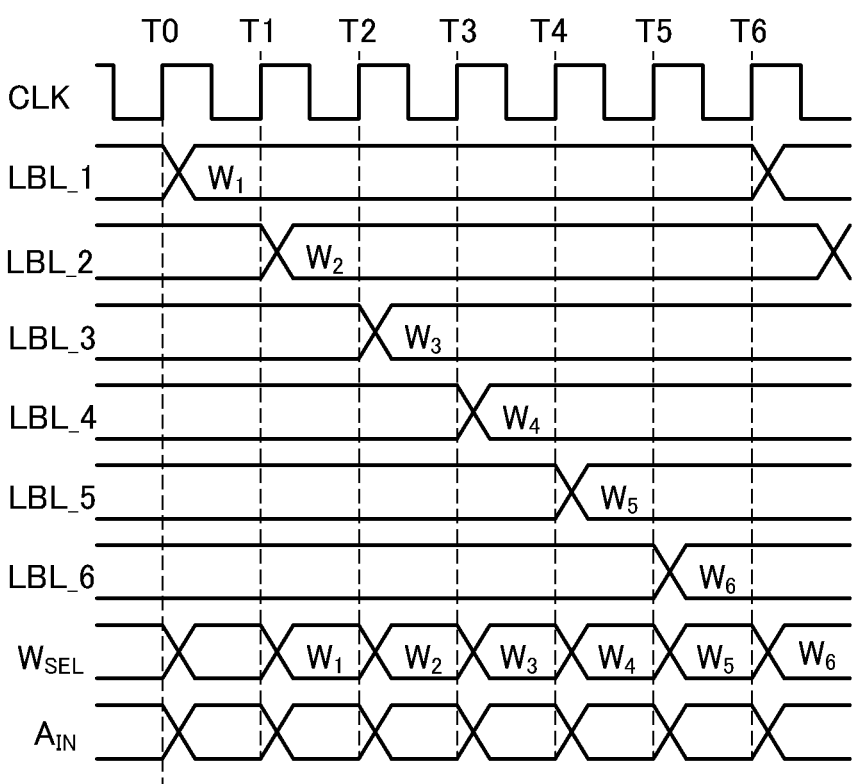
FIG. 8 is a diagram showing a structure example of a semiconductor device.

FIG. 8 is a timing chart showing the operation of the components described with reference to FIG. 7A. In the product-sum operation circuit 42, arithmetic processing is performed in accordance with toggle operation of a clock signal CLK (e.g., Time T0 to T6). Owing to a structure with increased frequency of the clock signal CLK, the speed of the arithmetic processing can be increased.

In the case where the input data $A_{IN}$ is switched at high speed in accordance with the clock signal CLK, data of the wiring GBL to which the weight data is supplied needs to be switched at high speed.

In the structure of one embodiment of the present invention, the weight data selected from the wiring LBL to the wiring GBL by the switching circuit 41 is read out to the wirings LBL_1 to LBL_6 in advance, whereby the data of the wiring GBL supplied with the weight data can be switched at high speed. For example, a structure can be employed in which the weight data $W_1$ is read out to the wiring LBL_1 at Time T0, and the weight data $W_1$ is output from the wiring LBL_1 to the wiring GBL by switching of the switching circuit 41 at Time T1. Also in a period from Time T1 to T6, switching of the weight data $W_{SEL}$ in response to the clock signal CLK is performed in such a manner that the time when the weight data $W_1$ to $W_6$ are read out to the wirings LBL is different from the time when the weight data $W_{SEL}$ is selected in the wiring GBL.

Figures 9A, 9B:
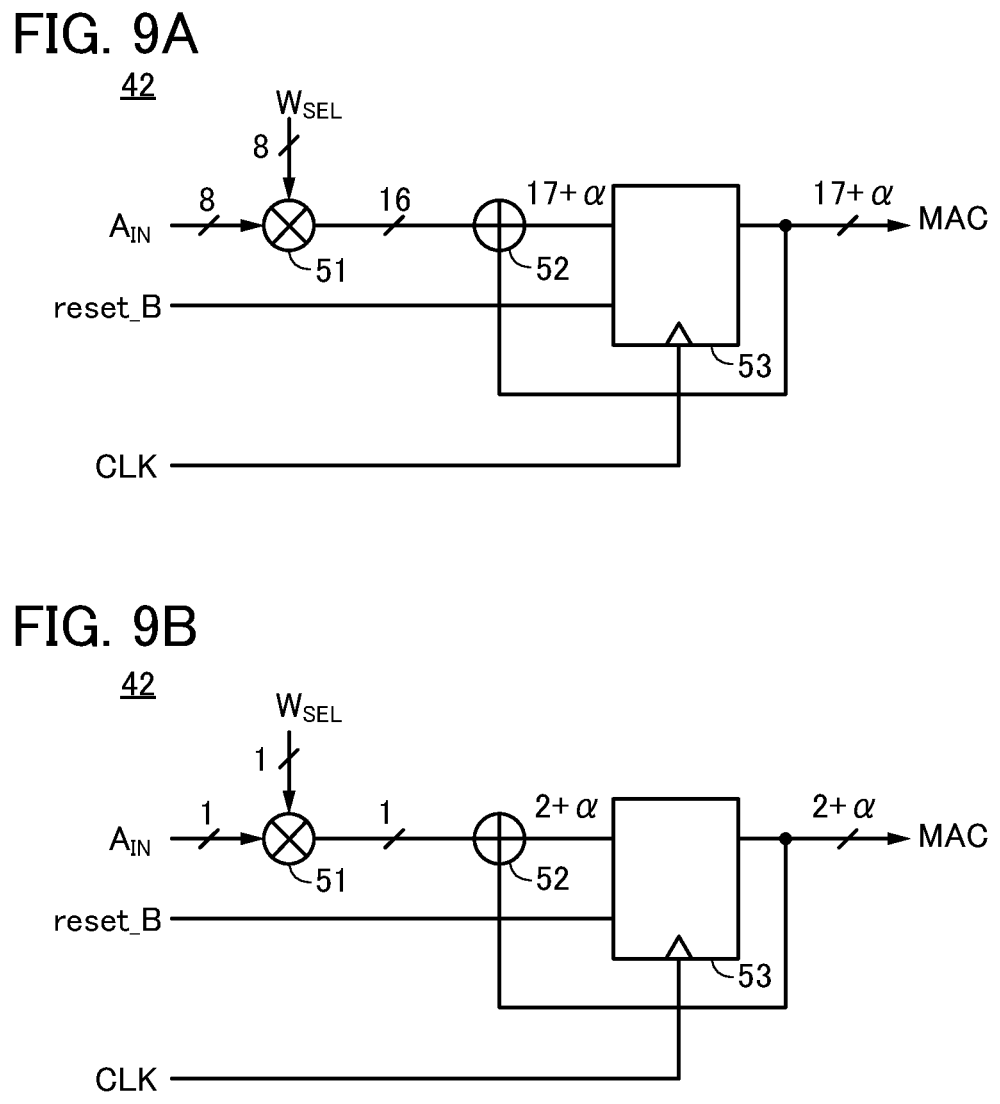

FIG. 9A illustrates a specific structure example of the product-sum operation circuit 42. FIG. 9A illustrates a structure example of the product-sum operation circuit 42 capable of performing product-sum operation of 8-bit weight data and 8-bit input data. FIG. 9A illustrates a multiplier circuit 51, an adder circuit 52, and a register 53. To the adder circuit 52, 16-bit data multiplied in the multiplier circuit 51 is input. The output of the adder circuit 52 is retained in the register 53 and is added together with the data multiplied in the multiplier circuit 51 in the adder circuit 52; thus, product-sum operation is performed. The register 53 is controlled with the clock signal CLK and a reset signal reset_B. Note that "$\alpha$" of "17+$\alpha$" in the diagram denotes a carry caused by addition of the multiplied data. With such a structure, the data MAC corresponding to the product-sum operation of the weight data $W_{SEL}$ and the input data $A_{IN}$ can be obtained.

Although the arithmetic processing using 8-bit data is performed in FIG. 9A, one embodiment of the present invention is also applicable to a structure using 1-bit data. Such a structure is illustrated in FIG. 9B in a manner similar to that in FIG. 9A. In the case of 1-bit data, arithmetic processing based on the number of bits is performed as illustrated in FIG. 9B.

Figure 10:
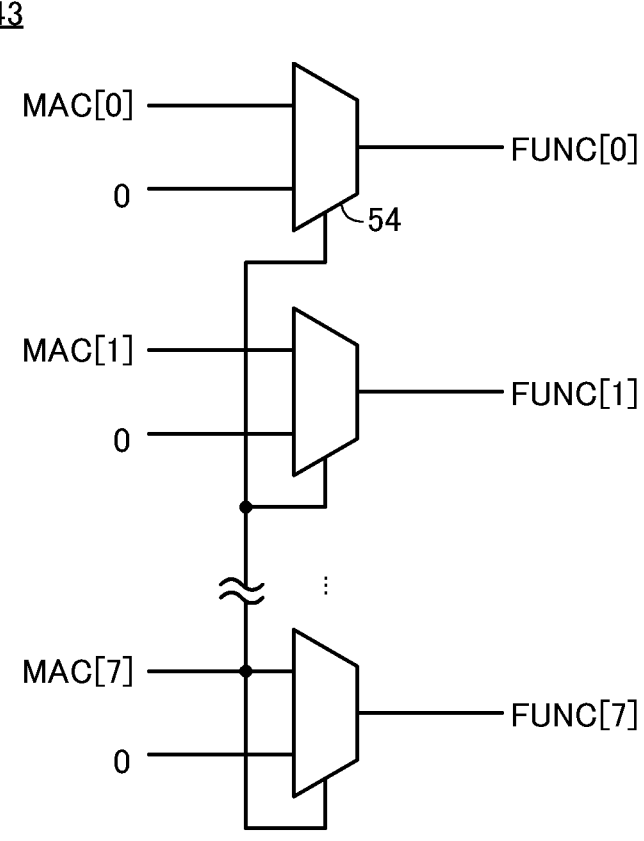
FIG. 10 is a diagram illustrating a structure example of a semiconductor device.

FIG. 10 is a diagram illustrating a structure example of the activation function operation circuit 43. The activation function operation circuit 43 illustrated in FIG. 10 is a circuit having a function of performing arithmetic operation of an activation function based on a ReLU function, for example.

The activation function operation circuit 43 illustrated in FIG. 10 includes a plurality of multiplexers 54. To the multiplexers 54, 8-bit data MAC[0] to MAC[7] are input, for example. Data 0 is also input to the multiplexers 54. The multiplexers 54 output the data MAC[0] to MAC[7] or the data 0 as data FUNC[0] to FUNC[7] depending on the data MAC[7], which is the most significant bit among the data MAC. In the case where the pieces of data MAC are signed integers, the most significant bit of the data MAC of 0 represents a positive value and that of 1 represents a negative value; thus, the activation function operation circuit 43 can perform arithmetic operation of an activation function based on a ReLU function.

Figure 11:
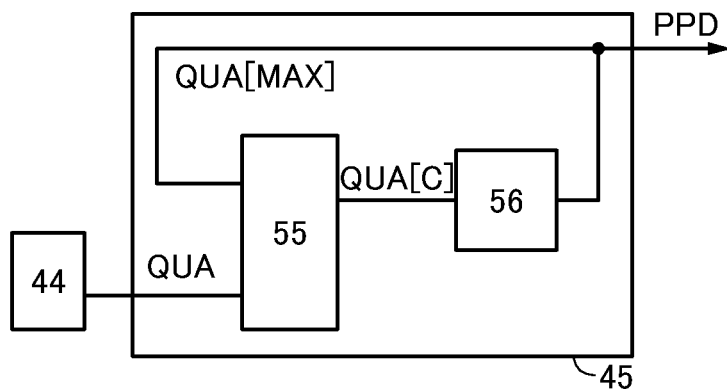
FIG. 11 is a diagram illustrating a structure example of a semiconductor device.

FIG. 11 is a diagram illustrating a structure example of the pre-pooling operation circuit 45. The pre-pooling operation circuit 45 illustrated in FIG. 11 is a circuit having a function of performing arithmetic operation of pre-pooling operation processing based on max pooling, for example.

The pre-pooling operation circuit 45 illustrated in FIG. 11 includes a comparison circuit 55 and a register 56. To the comparison circuit 55, the data QUA output from the quantization operation circuit 44 and data to be an initial value or data input from the register 56 are input. The comparison circuit 55 compares the two pieces of input data and outputs the data with a larger value as data QUA[C] to the register 56. The data QUA[C] is retained in the register 56. The retained data QUA[C] becomes the data PPD, which is the output signal from the pre-pooling operation circuit 45, or data QUA[MAX] input to the comparison circuit 55.

Figure 12:
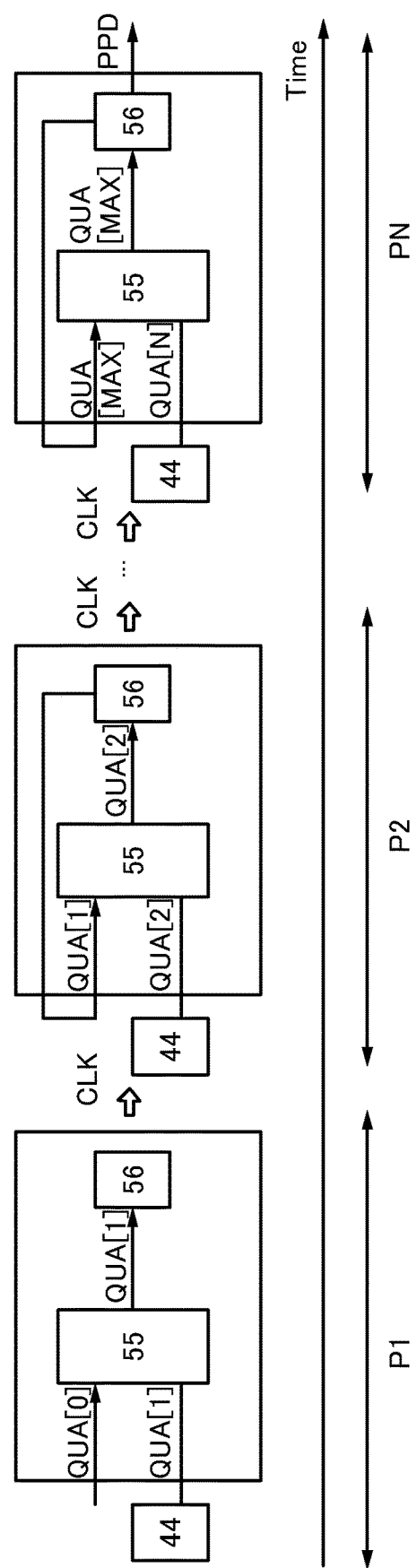
FIG. 12 is a diagram illustrating a structure example of a semiconductor device.

The operation of the pre-pooling operation circuit 45 is described with reference to FIG. 12. In FIG. 12, as the data QUA output from the quantization operation circuit 44, data QUA[1] and data QUA[2] to data QUA[N] are input in succession in accordance with a change in the clock signal CLK. Data input as an initial value to the comparison circuit 55 is data QUA[0].

In a period P1, the data QUA[0] and the data QUA[1] are input to the comparison circuit 55. In the case where the data QUA[1] has a larger value than the data QUA[0], the data QUA[1] is output data from the comparison circuit 55, i.e., the data QUA[1] is retained as the data QUA[C] in the register 56.

Next, in a period P2, the data QUA[2] is input to the comparison circuit 55 in accordance with a change in the clock signal CLK. To the comparison circuit 55, the data QUA[1] retained in the register 56 in the period P1 is input. In the case where the data QUA[2] has a larger value than the data QUA[1], the data QUA[2] is output data from the comparison circuit 55, i.e., the data QUA[2] is retained as the data QUA[C] in the register 56.

The values of the sequentially input data QUA are compared in the comparison circuit 55 and the data with the largest value is retained in the register 56, so that the data QUA[MAX] with the largest value among the input data QUA is retained in the register 56. In a period PN, the data QUA[N] is input to the comparison circuit 55. To the comparison circuit 55, the data QUA[MAX] that has been retained in the register 56 by the end of a period P(N−1) is input. In the case where the data QUA[MAX] has a larger value than the data QUA[N], the data QUA[MAX] is output data from the comparison circuit 55, i.e., the data QUA[MAX] is retained as the data QUA[C] in the register 56. Then, the data QUA[MAX] retained in the register 56 is output as the data PPD.

The operation described with reference to FIG. 12 is performed in a plurality of dedicated arithmetic circuits and the resulting pieces of data PPD are compared again, so that the data PD through pooling operation processing can be obtained.

Figures 13A, 13B:
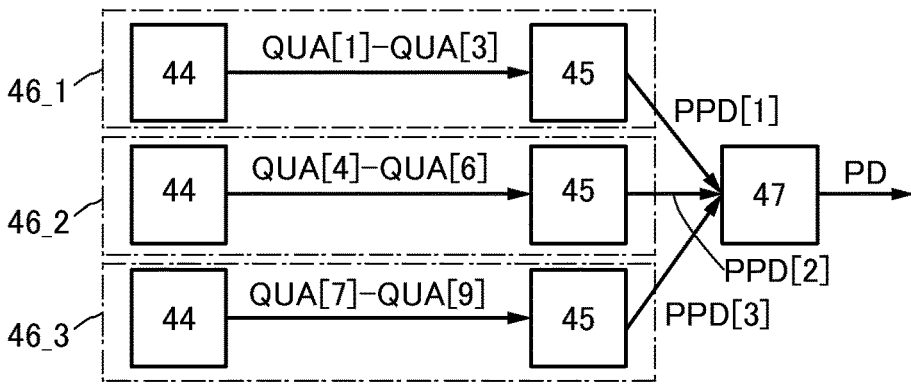
FIG. 13A and FIG. 13B are diagrams illustrating a struc- ture example of a semiconductor device.

The case where dedicated arithmetic circuits 46_1 to 46_3 are provided to perform 3×3 pooling operation processing, as in a structure example illustrated in FIG. 13A, is described, for example. In the dedicated arithmetic circuits 46_1 to 46_3, data QUA[1] to [9] from the quantization operation circuits 44 are separately processed, so that data PPD[1] to [3] can be obtained in the pre-pooling operation circuits 45. That is, the pre-pooling operation circuits 45 can extract the largest values of one-dimensional data as the data PPD output from the pre-pooling operation circuits 45. The post-pooling operation circuit 47 in the processing circuit 15 compares the data PPD[1] to [3] to obtain the data PD. The post-pooling operation circuit 47 has a function of a comparison circuit that compares the values of the input data PPD. In other words, the post-pooling operation circuit 47 can extract the largest value of 3×3 two-dimensional data, i.e., the data PD of 3×3 max pooling, as output data.

In the example of FIG. 13A, the data QUA[1] to [9] are separately processed specifically by the operation illustrated in FIG. 13B, whereby the data PPD[1] to [3] can be obtained in the pre-pooling operation circuits 45. For example, the dedicated arithmetic circuit 46_1 compares the data QUA[1] to [3] to obtain the data PPD[1]. The dedicated arithmetic circuit 46_2 compares the data QUA[4] to [6] to obtain the data PPD[2]. The dedicated arithmetic circuit 46_3 compares the data QUA[7] to [9] to obtain the data PPD[3]. With such a structure, the data PPD is obtained using different dedicated arithmetic circuits; thus, the data PPD can be obtained with a small number of clocks.

Figure 14A:
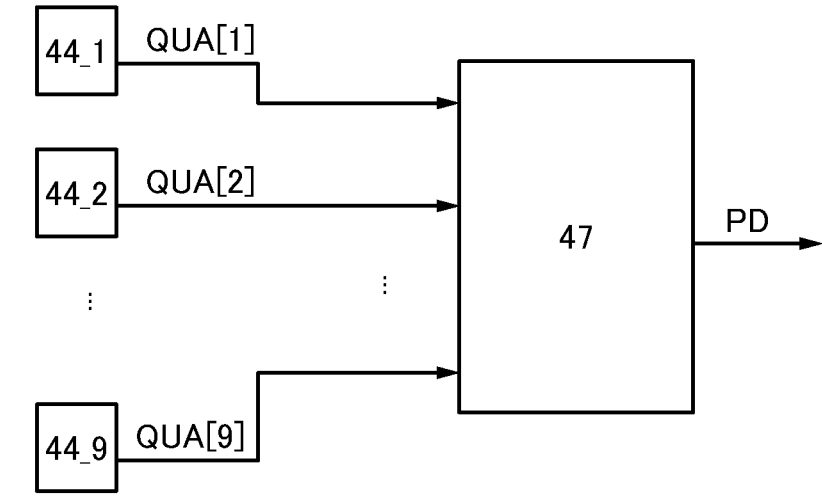
FIG. 14A and FIG. 14B are diagrams illustrating a struc- ture example of a semiconductor device.

For example, in the case where the data QUA[1] to [9] are output from the plurality of quantization operation circuits 44_1 to 44_9 to the post-pooling operation circuit 47 to obtain the data PD without obtaining the data PPD in the pre-pooling operation circuit 45 as illustrated in FIG. 14A, the number of wirings for transmitting data increases. This sometimes makes it difficult to reduce the size and power consumption of the semiconductor device 10.

Figure 14B:
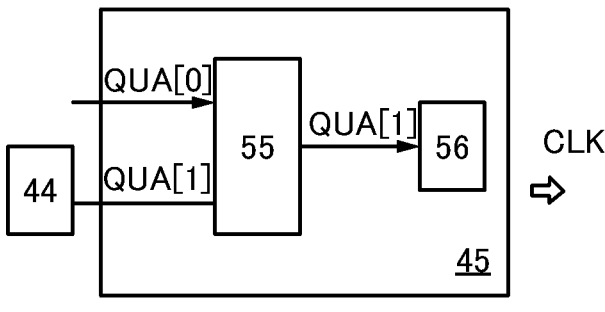
Figure 14B:
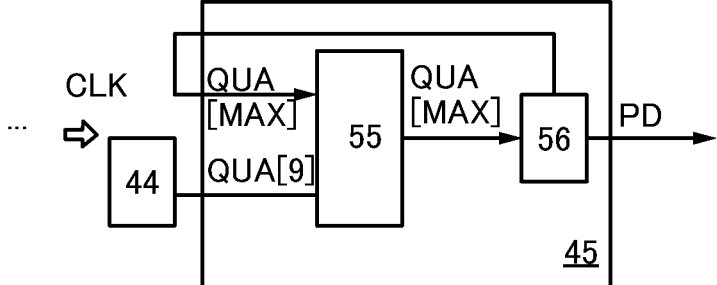

For example, in the case where the data QUA[1] to [9] input to one pre-pooling operation circuit 45 are compared to obtain the data PD as illustrated in FIG. 14B, time for obtaining the data PD increases in accordance with the number of pieces of data QUA, which sometimes makes it difficult to increase the speed of the arithmetic processing in the semiconductor device 10.

In the case where each arithmetic processing in a neural network is performed in the dedicated arithmetic circuit in the structure of the semiconductor device 10 in this embodiment, arithmetic processing using a plurality of pieces of data, such as pooling operation processing, can be performed in a distributed manner. Wirings connecting the dedicated arithmetic circuit and the product-sum operation circuit can be shortened, thereby inhibiting an increase in the area where the dedicated arithmetic circuit is provided. The plurality of memory circuits can be provided in the dedicated arithmetic circuit, which can increase the area where the memory circuits can be provided. As a result, an enormous amount of weight data can be retained in the memory circuit portion and thus the number of times of weight data transfer from an external memory circuit can be reduced, so that the power consumption can be reduced.

Figure 15:
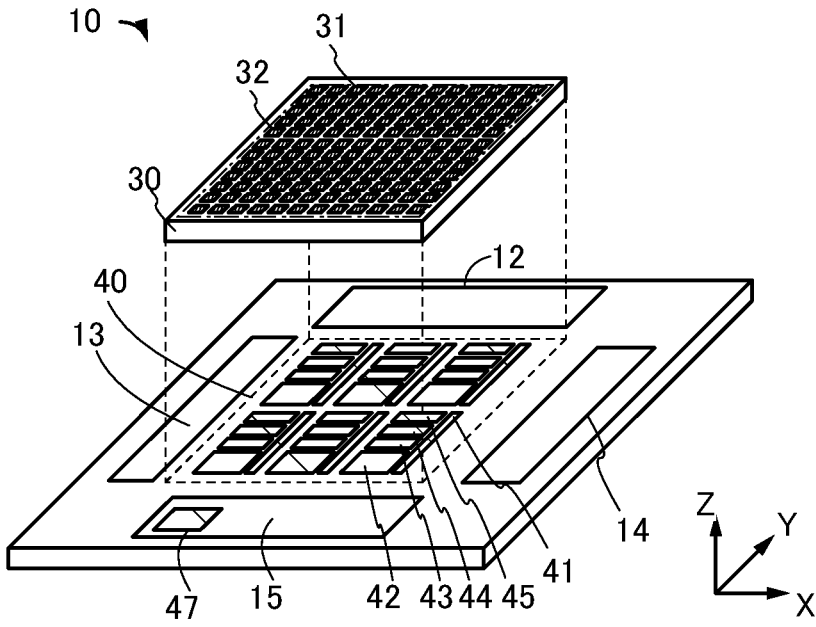
FIG. 15 is a diagram illustrating a structure example of a semiconductor device.

FIG. 15 illustrates structure examples of the memory circuit portion 30, which is provided to be stacked over the arithmetic circuit portion 40 and is described with reference to FIG. 1A and FIG. 1B, and its peripheral circuits. Specifically, FIG. 15 illustrates the driver circuit 12, the driver circuit 13, the control circuit 14, the processing circuit 15, the switching circuit 41, the product-sum operation circuit 42, the activation function operation circuit 43, the quantization operation circuit 44, and the pre-pooling operation circuit 45. FIG. 15 also illustrates the post-pooling operation circuit 47 in the processing circuit 15.

Although not illustrated in FIG. 15, control signals for controlling the circuits, input data, and output data are input and output between the circuits in FIG. 15 and an external circuit.

Figure 16A:
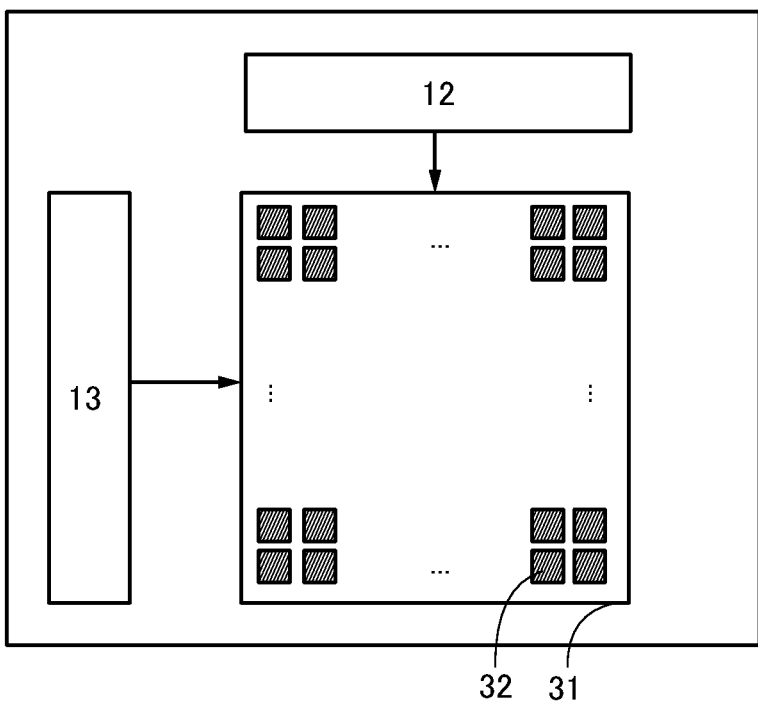
FIG. 16A and FIG. 16B are diagrams illustrating a struc- ture example of a semiconductor device.

FIG. 16A is a diagram of blocks for controlling the memory circuit portion 30, which are extracted from the structure illustrated in FIG. 15. FIG. 16A illustrates the driver circuit 12 and the driver circuit 13 in addition to the memory circuits 32 included in the circuit block 31 in the memory circuit portion 30.

The driver circuit 12 and the driver circuit 13 process input signals from the outside to generate signals for writing weight data to the memory circuits and signals for reading out weight data from the memory circuits. The generated signals are supplied to the memory circuits through wirings.

Figure 16B:
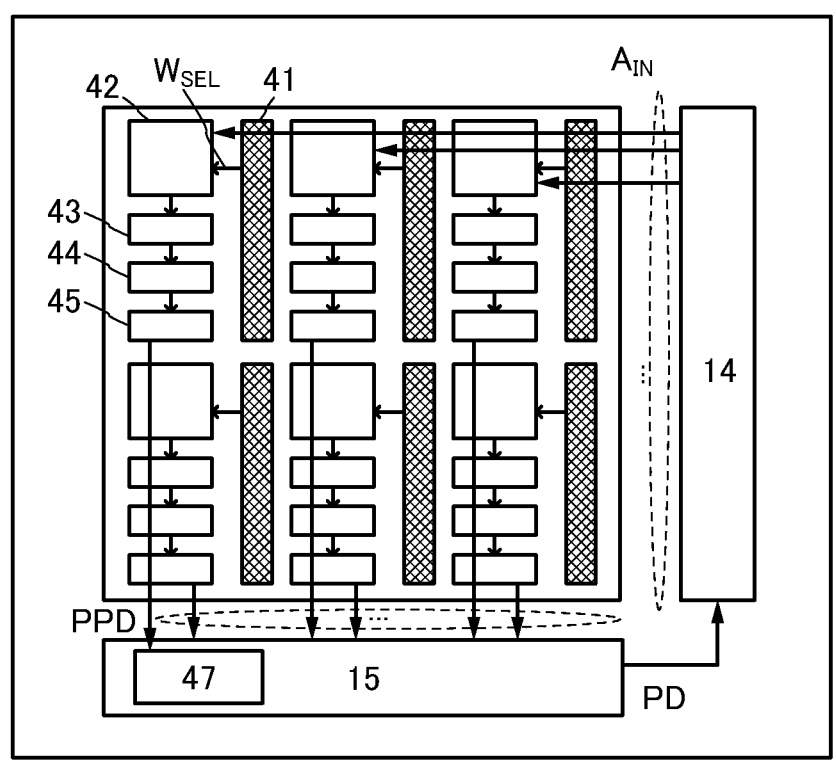

FIG. 16B is a diagram of blocks for controlling the arithmetic circuit portion 40, which are extracted from the structure illustrated in FIG. 15. FIG. 16B illustrates the control circuit 14, the processing circuit 15, and the post-pooling operation circuit 47 in the processing circuit 15 in addition to the switching circuit 41, the product-sum operation circuit 42, the activation function operation circuit 43, the quantization operation circuit 44, and the pre-pooling operation circuit 45 included in the arithmetic circuit portion 40.

The control circuit 14 generates the input data $A_{IN}$ and outputs it to the product-sum operation circuit 42. The control circuit 14 outputs a control signal for controlling the switching circuit 41. The switching circuit 41 selects weight data to be read out from the memory circuit 32 and outputs the weight data as the weight data $W_{SEL}$ to the product-sum operation circuit 42. In the dedicated arithmetic circuits such as the activation function operation circuit 43, the quantization operation circuit 44, and the pre-pooling operation circuit 45, the data MAC generated in the product-sum operation circuit 42 is subjected to arithmetic processing and the data PPD obtained through pre-pooling operation processing is output to the post-pooling operation circuit 47 in the processing circuit 15. The post-pooling operation circuit 47 in the processing circuit 15 outputs the data PD obtained through pooling operation processing to the control circuit 14, and the input data $A_{IN}$ is generated in the control circuit 14. The generated data is input to the arithmetic circuit portion 40 again.

In the semiconductor device 10, the control circuit 14 can output the data obtained through arithmetic processing to the arithmetic circuit portion 40 again as input data. Therefore, it is possible to execute arithmetic processing without reading out data in the middle of arithmetic operation to a main memory or the like outside the semiconductor device 10. Furthermore, in the semiconductor device 10, the memory circuit portion and the arithmetic circuit portion can be electrically connected to each other through a wiring in an opening portion provided in an insulating film or the like; thus, the number of parallel processes can be increased with the increasing number of wirings. Thus, parallel computation for the number of bits greater than or equal to the data bus width of the CPU 110 is possible in the semiconductor device 10. The circuits performing dedicated arithmetic processing such as activation function operation processing in addition to the product-sum operation circuit can be provided to be stacked with the memory circuits, which can increase the area where the memory circuits can be provided. As a result, an enormous amount of weight data can be retained in the memory circuit portion and thus the number of times of weight data transfer from an external memory circuit can be reduced, so that the power consumption can be reduced.

The structure in which one arithmetic processing, like the pooling operation processing in one embodiment of the present invention, is performed in a plurality of positions in a distributed manner can shorten the wirings connecting the dedicated arithmetic circuit and the product-sum operation circuit. Thus, the structure in which arithmetic processing is performed in a plurality of positions in a distributed manner is effective in inhibiting an increase in the area where the dedicated arithmetic circuit is provided. This structure is also effective in the case where the memory circuit portion and the arithmetic circuit portion illustrated in FIG. 1 are not stacked, e.g., the memory circuit portion 30, the arithmetic circuit portion 40, and the peripheral circuits such as the driver circuit 12, the driver circuit 13, the control circuit 14, and the processing circuit 15 are formed using Si transistors and the memory circuit portion 30 and the arithmetic circuit portion 40 are not stacked in the structure illustrated in FIG. 15, FIG. 16A, and FIG. 16B.

As described above, one embodiment of the present invention can provide a semiconductor device that is reduced in size and functions as an accelerator. Alternatively, one embodiment of the present invention can provide a semiconductor device with reduced power consumption, which functions as an accelerator. Alternatively, a semiconductor device with a novel structure, which functions as an accelerator, can be provided.

Embodiment 2

In this embodiment, an operation example of the case where the accelerator described as the semiconductor device 10 executes part of arithmetic operation of a program executed by the CPU 110 described in the above embodiment will be described.

Figure 17:
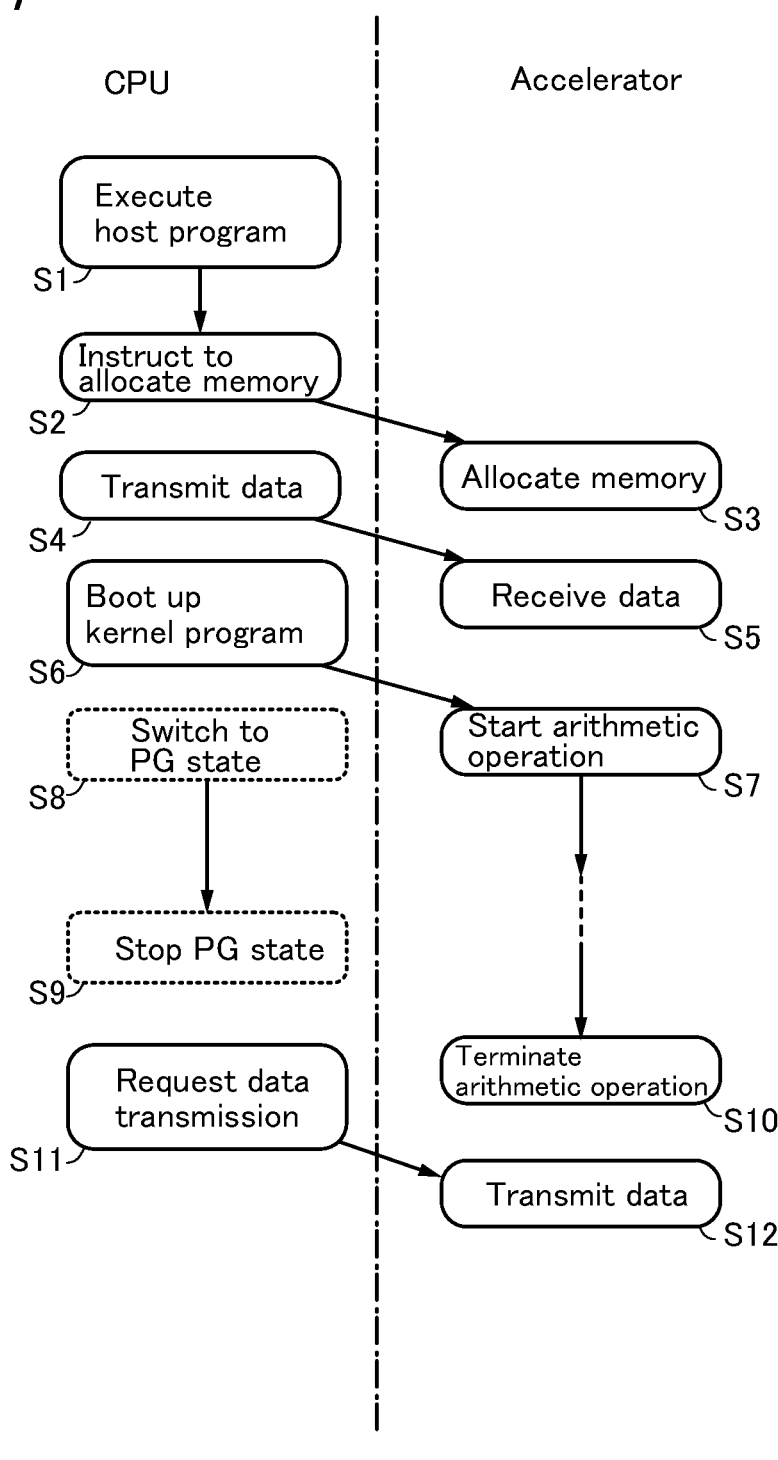
FIG. 17 is a diagram showing a structure example of an arithmetic processing system.

FIG. 17 is a diagram showing an operation example of the case where the accelerator executes part of arithmetic operation of a program executed by the CPU.

A host program is executed by the CPU (Execute host program; Step S1).

In the case where the CPU confirms an instruction to allocate, to a memory circuit portion, a region for data needed in performing arithmetic operation using the accelerator (Instruct to allocate memory; Step S2), the CPU allocates the region for the data to the memory circuit portion (Allocate memory; Step S3).

Next, the CPU transmits weight data that is data to be input from the main memory or an external memory device to the memory circuit portion (Transmit data; Step S4). The above-described memory circuit portion receives the weight data and stores the weight data in the region allocated in Step S3 (Receive data; Step S5).

In the case where the CPU confirms an instruction to boot up a kernel program (Boot up kernel program; Step S6), the accelerator starts execution of the kernel program (Start arithmetic operation; Step S7).

Immediately after the accelerator starts the execution of the kernel program, the CPU may be switched from the state of performing arithmetic operation to a PG (power gating) state (Switch to PG state; Step S8). In that case, just before the accelerator terminates the execution of the kernel program, the CPU is switched from the PG state to a state of performing arithmetic operation (Stop PG state; Step S9). By bringing the CPU into the PG state during the period from Step S8 to Step S9, the power consumption and heat generation of the arithmetic processing system as a whole can be inhibited.

When the accelerator terminates the execution of the kernel program, the output data is stored in a memory portion in the accelerator, which retains arithmetic operation results (Terminate arithmetic operation; Step S10).

After the execution of the kernel program is terminated, in the case where the CPU confirms an instruction to transmit the output data stored in the memory portion to the main memory or the external memory device (Request data transmission; Step S11), the above-described output data is transmitted to the main memory or the external memory device and stored in the main memory or the external memory device (Transmit data; Step S12).

By repeating the operation from Step S1 to Step S12 described above, part of the arithmetic operation executed by the CPU can be executed by the accelerator while the power consumption and heat generation of the CPU and the accelerator are inhibited. The semiconductor device of one embodiment of the present invention has a non-von Neumann architecture and can perform arithmetic processing with extremely low power consumption as compared with a von Neumann architecture, in which power consumption increases with increasing processing speed.

This embodiment can be combined with the description of the other embodiments as appropriate.

Embodiment 3

In this embodiment, an example of a CPU including a CPU core capable of power gating will be described.

Figure 18:
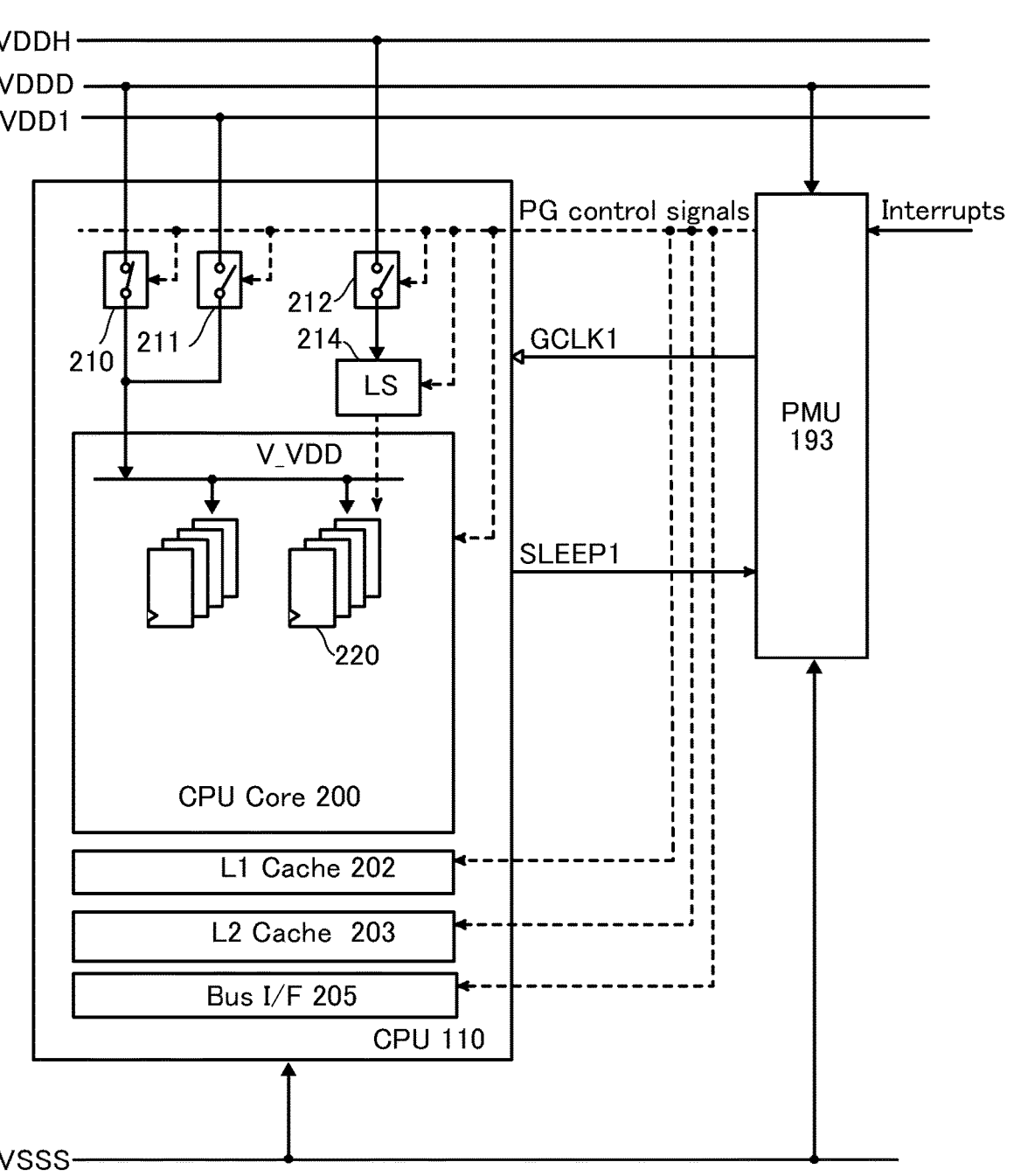
FIG. 18 is a diagram illustrating a structure example of a CPU.

FIG. 18 illustrates a structure example of the CPU 110. The CPU 110 includes the CPU core 200, an L1 (level 1) cache memory device (L1 Cache) 202, an L2 cache memory device (L2 Cache) 203, a bus interface portion (Bus I/F) 205, power switches 210 to 212, and a level shifter (LS) 214. The CPU core 200 includes a flip-flop 220.

Through the bus interface portion 205, the CPU core 200, the L1 cache memory device 202, and the L2 cache memory device 203 are mutually connected to one another.

A PMU 193 generates a clock signal GCLK1 and various PG (power gating) control signals in response to signals such as an interrupt signal (Interrupts) input from the outside and a signal SLEEP1 issued from the CPU 110. The clock signal GCLK1 and the PG control signals are input to the CPU 110. The PG control signals control the power switches 210 to 212 and the flip-flop 220.

The power switches 210 and 211 control application of voltages VDDD and VDD1 to a virtual power supply line V_VDD (hereinafter, referred to as a V_VDD line), respectively. The power switch 212 controls application of a voltage VDDH to the level shifter (LS) 214. A voltage VSSS is input to the CPU 110 and the PMU 193 without through the power switches. The voltage VDDD is input to the PMU 193 without through the power switches.

The voltages VDDD and VDD1 are drive voltages for a CMOS circuit. The voltage VDD1 is lower than the voltage VDDD and is a drive voltage in a sleep state. The voltage VDDH is a drive voltage for an OS transistor and is higher than the voltage VDDD.

The L1 cache memory device 202, the L2 cache memory device 203, and the bus interface portion 205 each include at least a power domain capable of power gating. The power domain capable of power gating is provided with one or a plurality of power switches. These power switches are controlled by the PG control signals.

The flip-flop 220 is used for a register. The flip-flop 220 is provided with a backup circuit. The flip-flop 220 is described below.

Figure 19A:
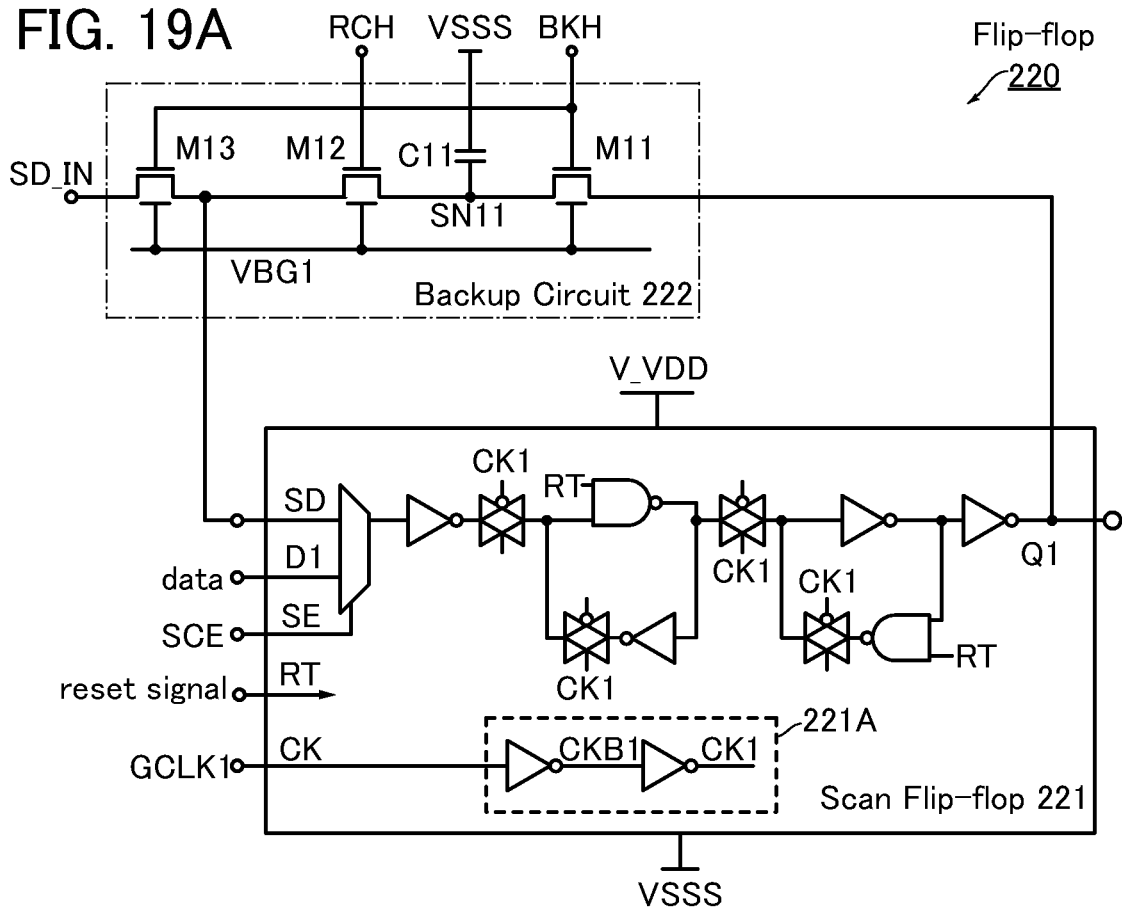
FIG. 19A and FIG. 19B are diagrams illustrating a struc- ture example of a CPU.

FIG. 19A illustrates a circuit structure example of the flip-flop 220. The flip-flop 220 includes a scan flip-flop 221 and the backup circuit 222.

The scan flip-flop 221 includes nodes D1, Q1, SD, SE, RT, and CK and a clock buffer circuit 221A.

The node D1 is a data input node, the node Q1 is a data output node, and the node SD is a scan test data input node. The node SE is a signal SCE input node. The node CK is a clock signal GCLK1 input node. The clock signal GCLK1 is input to the clock buffer circuit 221A. Respective analog switches in the scan flip-flop 221 are connected to nodes CK1 and CKB1 of the clock buffer circuit 221A. The node RT is a reset signal input node.

The signal SCE is a scan enable signal, which is generated in the PMU 193. The PMU 193 generates signals BK and RC. The level shifter 214 level-shifts the signals BK and RC to generate signals BKH and RCH. The signal BK is a backup signal and the signal RC is a recovery signal.

The circuit structure of the scan flip-flop 221 is not limited to that in FIG. 19. A flip-flop prepared in a standard circuit library can be used.

The backup circuit 222 includes nodes SD_IN and SN11, transistors M11 to M13, and a capacitor C11.

The node SD_IN is a scan test data input node and is connected to the node Q1 of the scan flip-flop 221. The node SN11 is a retention node of the backup circuit 222. The capacitor C11 is a storage capacitor for retaining the voltage of the node SN11.

The transistor M11 controls electrical continuity between the node Q1 and the node SN11. The transistor M12 controls electrical continuity between the node SN11 and the node SD. The transistor M13 controls electrical continuity between the node SD_IN and the node SD. The on/off of the transistors M11 and M13 is controlled by the signal BKH, and the on/off of the transistor M12 is controlled by the signal RCH.

The transistors M11 to M13 are OS transistors like the transistors 61 to 63 included in the above-described memory circuit 32. The transistors M11 to M13 have back gates in the illustrated structure. The back gates of the transistors M11 to M13 are connected to a power supply line for supplying a voltage VBG1.

At least the transistors M11 and M12 are preferably OS transistors. Because of an extremely low off-state current, which is a feature of the OS transistor, a decrease in the voltage of the node SN11 can be suppressed and almost no power is consumed to retain data; therefore, the backup circuit 222 has a nonvolatile characteristic. Data is rewritten by charge and discharge of the capacitor C11; hence, there is theoretically no limitation on rewrite cycles of the backup circuit 222, and data can be written and read out with low energy.

Figure 19B:
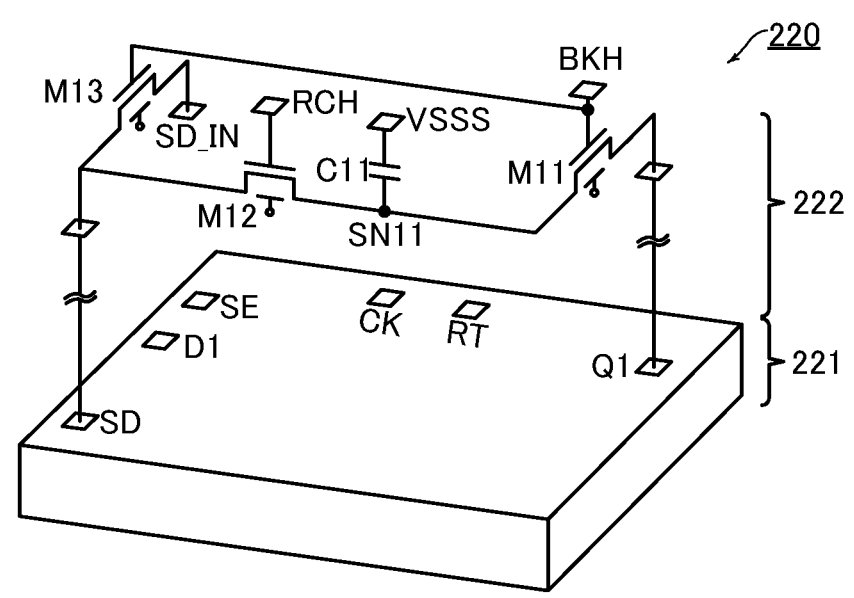

All of the transistors in the backup circuit 222 are extremely preferably OS transistors. As illustrated in FIG. 19B, the backup circuit 222 can be stacked on the scan flip-flop 221 configured with a silicon CMOS circuit.

The number of elements in the backup circuit 222 is much smaller than the number of elements in the scan flip-flop 221; thus, there is no need to change the circuit structure and layout of the scan flip-flop 221 in order to stack the backup circuit 222. That is, the backup circuit 222 is a backup circuit that has very broad utility. In addition, the backup circuit 222 can be provided in a region where the scan flip-flop 221 is formed; thus, even when the backup circuit 222 is incorporated, the area overhead of the flip-flop 220 can be zero. Thus, the backup circuit 222 is provided in the flip-flop 220, whereby power gating of the CPU core 200 is enabled. The power gating of the CPU core 200 is enabled with high efficiency owing to little energy necessary for the power gating.

When the backup circuit 222 is provided, parasitic capacitance due to the transistor M11 is added to the node Q1. However, the parasitic capacitance is lower than parasitic capacitance due to a logic circuit connected to the node Q1; thus, there is no influence of the parasitic capacitance on the operation of the scan flip-flop 221. That is, even when the backup circuit 222 is provided, the performance of the flip-flop 220 does not substantially decrease.

The CPU core 200 can be set to a clock gating state, a power gating state, or a resting state as a low power consumption state. The PMU 193 selects the low power consumption mode of the CPU core 200 on the basis of the interrupt signal, the signal SLEEP1, and the like. For example, in the case of transition from a normal operation state to a clock gating state, the PMU 193 stops generation of the clock signal GCLK1.

For example, in the case of transition from a normal operation state to a resting state, the PMU 193 performs voltage and/or frequency scaling. For example, when the voltage scaling is performed, the PMU 193 turns off the power switch 210 and turns on the power switch 211 to input the voltage VDD1 to the CPU core 200. The voltage VDD1 is a voltage at which data in the scan flip-flop 221 is not lost. When the frequency scaling is performed, the PMU 193 reduces the frequency of the clock signal GCLK1.

In the case where the CPU core 200 transitions from a normal operation state to a power gating state, data in the scan flip-flop 221 is backed up to the backup circuit 222. When the CPU core 200 is returned from the power gating state to the normal operation state, recovery operation of data in the backup circuit 222 to the scan flip-flop 221 is performed.

Figure 20:
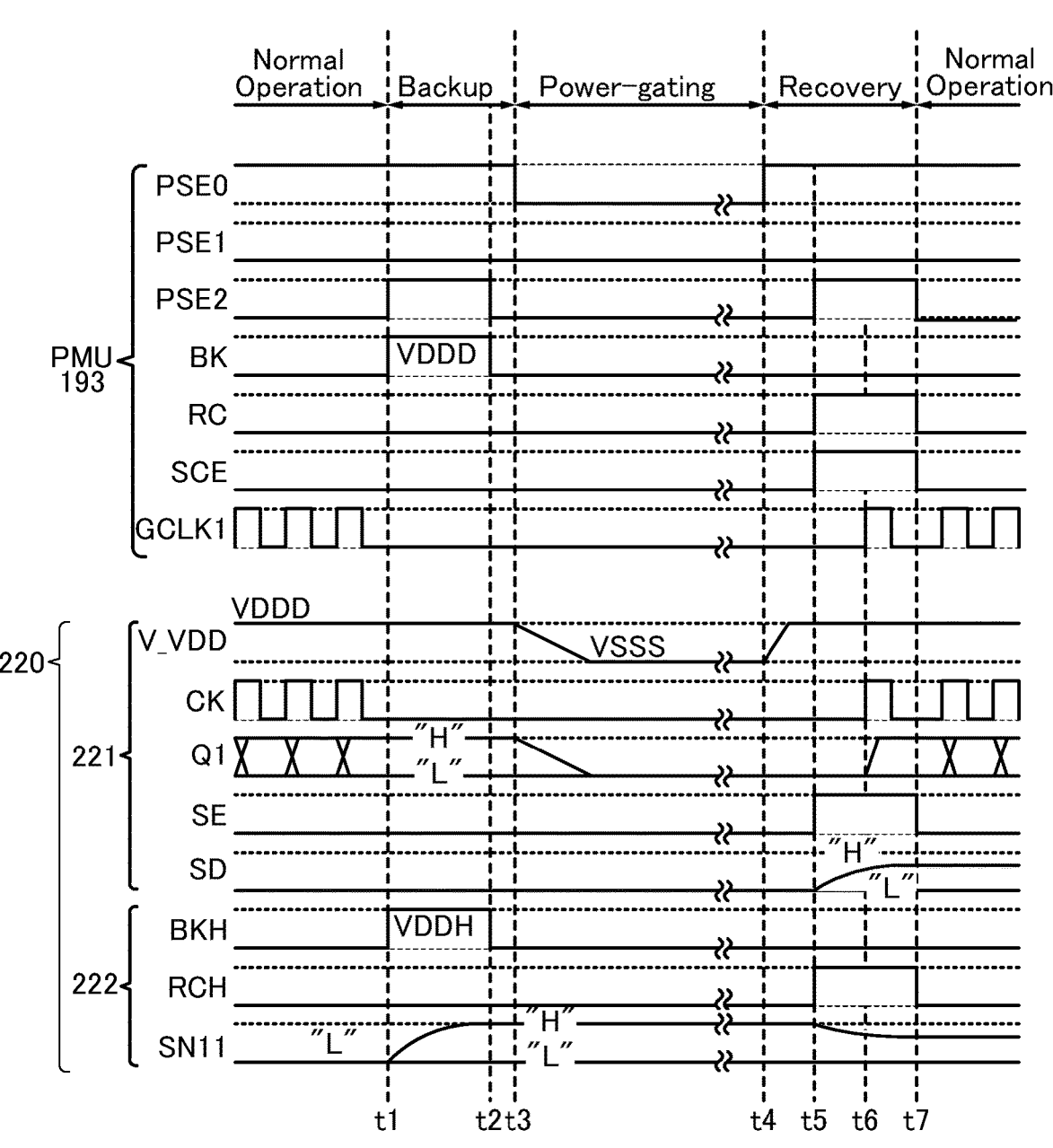
FIG. 20 is a diagram showing a structure example of a CPU.

FIG. 20 shows an example of the power gating sequence of the CPU core 200. Note that in FIGS. 20, t1 to t7 represent the time. Signals PSE0 to PSE2 are control signals of the power switches 210 to 212, which are generated in the PMU 193. When the signal PSE0 is at "H"/"L", the power switch 210 is on/off. The same applies to the signals PSE1 and PSE2.

Until Time t1, a normal operation is performed. The power switch 210 is on, and the voltage VDDD is input to the CPU core 200. The scan flip-flop 221 performs the normal operation. At this time, the level shifter 214 does not need to be operated; thus, the power switch 212 is off and the signals SCE, BK, and RC are each at "L". The node SE is at "L"; thus, the scan flip-flop 221 stores data in the node D1. Note that in the example of FIG. 20, the node SN11 of the backup circuit 222 is at "L" at Time t1.

A backup operation is described. At Time t1, the PMU 193 stops the clock signal GCLK1 and sets the signals PSE2 and BK at "H". The level shifter 214 becomes active and outputs the signal BKH at "H" to the backup circuit 222.

The transistor M11 in the backup circuit 222 is turned on, and data in the node Q1 of the scan flip-flop 221 is written to the node SN11 of the backup circuit 222. When the node Q1 of the scan flip-flop 221 is at "L", the node SN11 remains at "L", whereas when the node Q1 is at "H", the node SN11 becomes "H".

The PMU 193 sets the signals PSE2 and BK at "L" at Time t2 and sets the signal PSE0 at "L" at Time t3. The state of the CPU core 200 transitions to a power gating state at Time t3. Note that at the timing when the signal BK falls, the signal PSE0 may fall.

A power-gating operation is described. When the signal PSE0 is set at "L", data in the node Q1 is lost because the voltage of the V_VDD line decreases. The node SN11 retains data that is stored in the node Q1 at Time t3.

A recovery operation is described. When the PMU 193 sets the signal PSE0 at "H" at Time t4, the power gating state transitions to a recovery state. Charge of the V_VDD line starts, and the PMU 193 sets the signals PSE2, RC, and SCE at "H" in a state where the voltage of the V_VDD line becomes VDDD (at Time t5).

The transistor M12 is turned on, and electric charge in the capacitor C11 is distributed to the node SN11 and the node SD. When the node SN11 is at "H", the voltage of the node SD increases. The node SE is at "H"; thus, data in the node SD is written to a latch circuit on the input side of the scan flip-flop 221. When the clock signal GCLK1 is input to the node CK at Time t6, data in the latch circuit on the input side is written to the node Q1. That is, data in the node SN11 is written to the node Q1.

When the PMU 193 sets the signals PSE2, SCE, and RC at "L" at Time t7, the recovery operation is terminated.

The backup circuit 222 using an OS transistor is extremely suitable for normally-off computing because both dynamic power consumption and static power consumption are low. Note that the CPU 110 including the CPU core 200 including the backup circuit 222 using an OS transistor can be referred to as NoffCPU (registered trademark). The NoffCPU includes a nonvolatile memory, and power supply to the NoffCPU can be stopped during the time when the NoffCPU does not need to operate. Even when the flip-flop 220 is mounted, a decrease in the performance and an increase in the dynamic power of the CPU core 200 can be made hardly to occur.

Note that the CPU core 200 may include a plurality of power domains capable of power gating. In the plurality of power domains, one or a plurality of power switches for controlling voltage input are provided. In addition, the CPU core 200 may include one or a plurality of power domains where power gating is not performed. For example, the power domain where power gating is not performed may be provided with a power gating control circuit for controlling the flip-flop 220 and the power switches 210 to 212.

Note that the application of the flip-flop 220 is not limited to the CPU 110. In the CPU 110, the flip-flop 220 can be used as the register provided in a power domain capable of power gating.

This embodiment can be combined with the description of the other embodiments as appropriate.

Embodiment 4

In this embodiment, structure examples of transistors that can be used in the CPU 110 described in the above embodiment and the accelerator described as the semiconductor device 10 will be described. As an example, a structure in which transistors having different electrical characteristics are stacked is described. With the structure, the flexibility in design of the semiconductor device can be increased. Stacking transistors having different electrical characteristics can increase the degree of integration of the semiconductor device.

Figure 21:
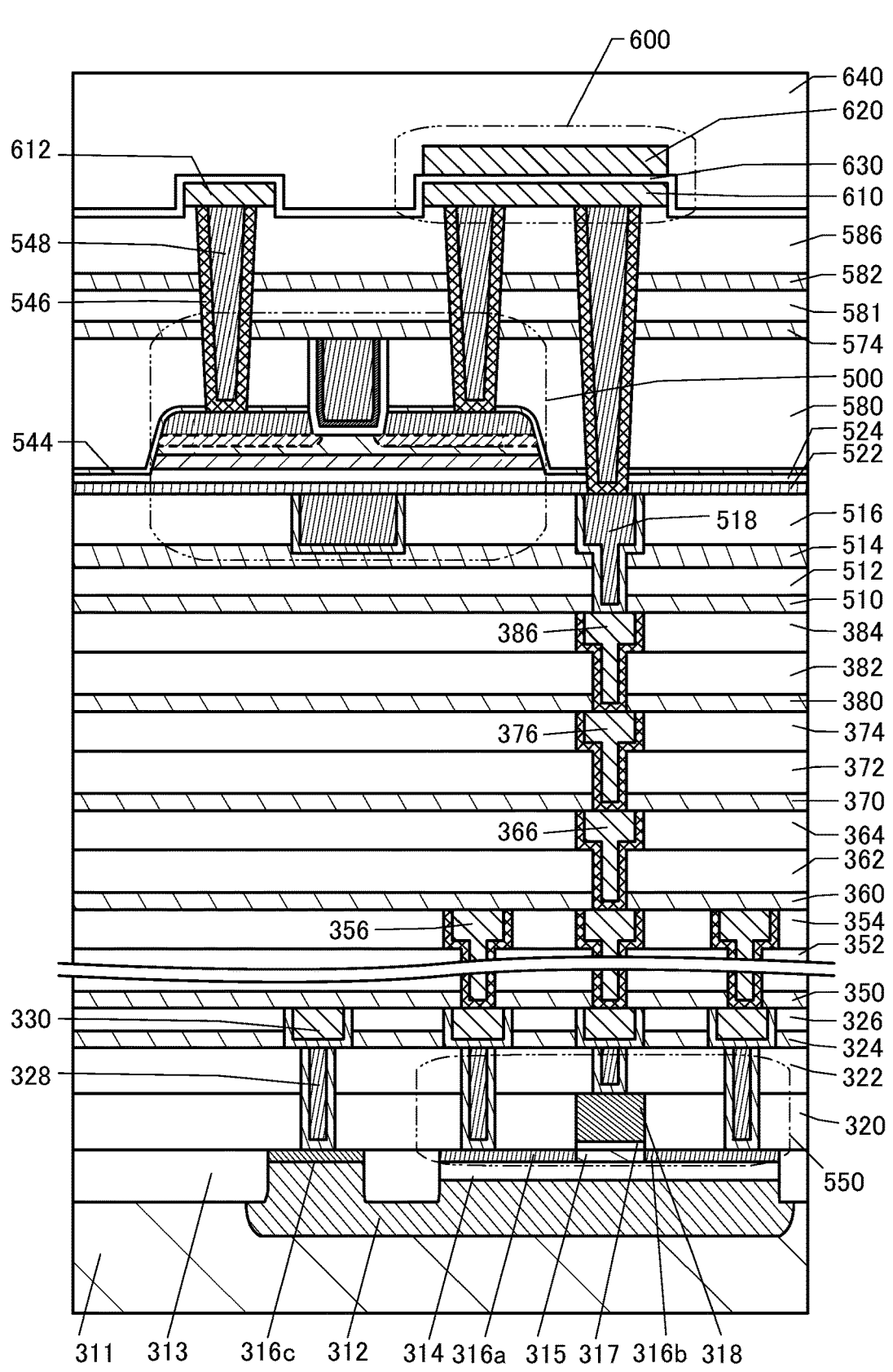
FIG. 21 is a diagram illustrating a structure example of a transistor.
Figure 22A:
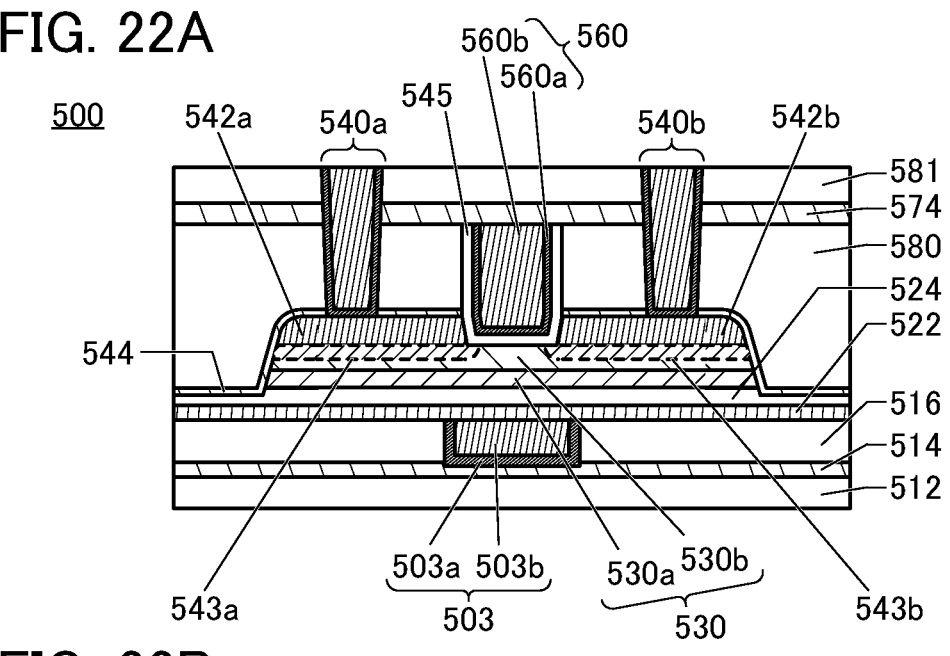
FIG. 22A and FIG. 22B are diagrams illustrating a struc- ture example of a transistor.
Figure 22B:
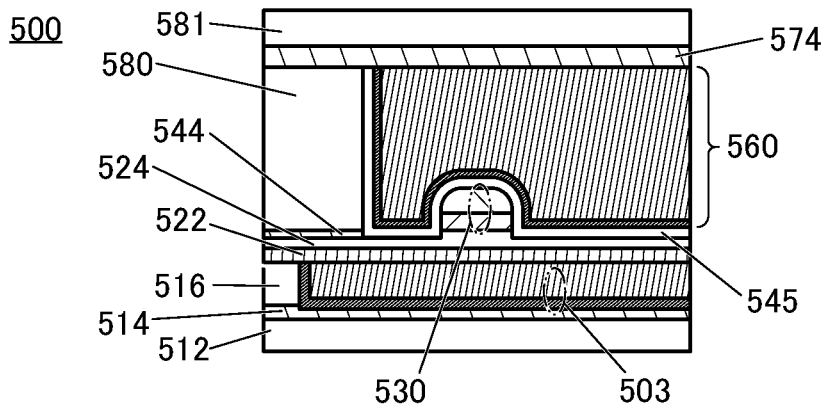

FIG. 21 illustrates part of a cross-sectional structure of a semiconductor device. The semiconductor device illustrated in FIG. 21 includes a transistor 550, a transistor 500, and a capacitor 600. FIG. 22A is a cross-sectional view of the transistor 500 in the channel length direction, and FIG. 22B is a cross-sectional view of the transistor 500 in the channel width direction. For example, the transistor 500 corresponds to an OS transistor included in the memory circuit 32 described in the above embodiment, that is, a transistor including an oxide semiconductor in its channel formation region. The transistor 550 corresponds to a Si transistor included in the arithmetic circuit portion 40 described in the above embodiment, that is, a transistor including silicon in its channel formation region. The capacitor 600 corresponds to a capacitor included in the memory circuit 32.

The transistor 500 is an OS transistor. The off-state current of an OS transistor is extremely low. Accordingly, data voltage or electric charge written to a storage node through the transistor 500 can be retained for a long time. In other words, power consumption of the semiconductor device can be reduced because the storage node has a low frequency of refresh operation or requires no refresh operation.

In FIG. 21, the transistor 500 is provided above the transistor 550, and the capacitor 600 is provided above the transistor 550 and the transistor 500.

The transistor 550 is provided on a substrate 311. The substrate 311 is a p-type silicon substrate, for example. The substrate 311 may be an n-type silicon substrate. An oxide layer 314 is preferably an insulating layer formed with an oxide buried (Burned oxide) into the substrate 311 (the insulating layer is also referred to as a BOX layer), e.g., silicon oxide. The transistor 550 is formed using single crystal silicon provided over the substrate 311 with the oxide layer 314 sandwiched therebetween; that is, the transistor 550 is provided on an SOI (Silicon On Insulator) substrate.

The substrate 311 included in the SOI substrate is provided with an insulator 313 serving as an element isolation layer. The substrate 311 includes a well region 312. The well region 312 is a region to which n-type or p-type conductivity is imparted in accordance with the conductivity of the transistor 550. The single crystal silicon in the SOI substrate is provided with a semiconductor region 315 and a low-resistance region 316a and a low-resistance region 316b functioning as a source region and a drain region. A low-resistant region 316c is provided over the well region 312.

The transistor 550 can be provided to overlap with the well region 312 to which an impurity element imparting conductivity is added. The well region 312 can function as a bottom gate electrode of the transistor 550 by independently changing the potential through the low-resistance region 316c. Moreover, the threshold voltage of the transistor 550 can be controlled. In particular, when a negative potential is applied to the well region 312, the threshold voltage of the transistor 550 can be further increased, and the off-state current can be reduced. Thus, a negative potential is applied to the well region 312, so that a drain current when a potential applied to a gate electrode of the Si transistor is 0 V can be reduced. As a result, power consumption due to shoot-through current or the like in the arithmetic circuit portion 40 including the transistor 550 can be reduced, and the arithmetic efficiency can be improved.

The transistor 550 preferably has a structure in which the top surface and the side surface in the channel width direction of the semiconductor layer are covered with a conductor 318 with an insulator 317 therebetween, that is, a Fin-type structure. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

The conductor 318 sometimes functions as a first gate (also referred to as top gate) electrode. In addition, the well region 312 sometimes functions as a second gate (also referred to as bottom gate) electrode. In that case, a potential applied to the well region 312 can be controlled through the low-resistance region 316c.

A region of the semiconductor region 315 where a channel is formed, a region in the vicinity thereof, the low-resistance region 316a and the low-resistance region 316b functioning as a source region and a drain region, the low-resistance region 316c connected to an electrode controlling a potential of the well region 312, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be a HEMT (High Electron Mobility Transistor) with use of GaAs and GaAlAs, or the like.

The well region 312, the low-resistance region 316a, the low-resistance region 316b, and the low-resistance region 316c contain an element that imparts n-type conductivity, such as arsenic or phosphorus, or an element that imparts p-type conductivity, such as boron, in addition to the semiconductor material used for the semiconductor region 315.

For the conductor 318 functioning as a gate electrode, a semiconductor material such as silicon containing the element that imparts n-type conductivity, such as arsenic or phosphorus, or the element that imparts p-type conductivity, such as boron, or a conductive material such as a metal material, an alloy material, or a metal oxide material can be used. Alternatively, silicide such as nickel silicide may be used for the conductor 318.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

To form each of the low-resistance region 316a, the low-resistance region 316b, and the low-resistance region 316c, another conductor, for example, silicide such as nickel silicide may be stacked. With this structure, the conductivity of the region functioning as an electrode can be increased. At this time, an insulator functioning as a sidewall spacer (also referred to as a sidewall insulating layer) may be provided at the side surface of the conductor 318 functioning as a gate electrode and the side surface of the insulator functioning as a gate insulating film. This structure can prevent electrical continuity from being established between the conductor 318 and each of the low-resistance region 316a and the low-resistance region 316b.

An insulator 320, an insulator 322, an insulator 324, and an insulator 326 are provided to be stacked in this order to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen in its composition, and silicon nitride oxide refers to a material that contains nitrogen at a higher proportion than oxygen in its composition. Furthermore, in this specification, aluminum oxynitride refers to a material that contains oxygen at a higher proportion than nitrogen in its composition, and aluminum nitride oxide refers to a material that contains nitrogen at a higher proportion than oxygen in its composition.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to improve planarity.

In addition, for the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 21, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 21, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 21, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 21, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property against hydrogen or impurities diffused from the substrate 311, a region where the transistor 550 is provided, or the like into the region where the transistor 500 is provided. Therefore, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent entry of impurities such as hydrogen and moisture into the transistor 500 in the manufacturing process and after the manufacture of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a relatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 22A and FIG. 22B, the transistor 500 includes the conductor 503 positioned to be embedded in the insulator 514 and the insulator 516; an insulator 522 positioned over the insulator 516 and the conductor 503; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an insulator 545 positioned on a bottom surface and a side surface of an opening; and a conductor 560 positioned on a formation surface of the insulator 545.

In addition, as illustrated in FIG. 22A and FIG. 22B, an insulator 544 is preferably positioned between the insulator 580 and the oxide 530a, the oxide 530b, the conductor 542a, and the conductor 542b. Furthermore, as illustrated in FIG. 22A and FIG. 22B, the conductor 560 preferably includes a conductor 560a provided inside the insulator 545 and a conductor 560b provided to be embedded inside the conductor 560a. Moreover, as illustrated in FIG. 22A and FIG. 22B, an insulator 574 is preferably positioned over the insulator 580, the conductor 560, and the insulator 545.

Note that in this specification and the like, the oxide 530a and the oxide 530b are sometimes collectively referred to as an oxide 530.

Note that although a structure of the transistor 500 in which two layers of the oxide 530a and the oxide 530b are stacked in a region where a channel is formed and its vicinity is illustrated, the present invention is not limited thereto. For example, it is possible to employ a structure in which a single layer of the oxide 530b or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 21, FIG. 22A, and FIG. 22B is an example, and the structures are not limited thereto; an appropriate transistor can be used in accordance with a circuit structure, a driving method, or the like.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 not in synchronization with but independently of a potential applied to the conductor 560. In particular, when a negative potential is applied to the conductor 503, the threshold voltage of the transistor 500 can be further increased, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material having a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, the function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 is illustrated to have a stacked layer of the conductor 503a and the conductor 503b in this embodiment, the conductor 503 may have a single-layer structure.

The insulator 522 and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the insulator by heating. In this specification and the like, oxygen released by heating is sometimes referred to as "excess oxygen". That is, a region containing excess oxygen (also referred to as an "excess-oxygen region") is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_O H$ in some cases) serve as donors and generate electrons serving as carriers in some cases. In other cases, bonding of part of hydrogen to oxygen bonded to a metal atom generates electrons serving as carriers. Thus, a transistor using an oxide semiconductor that contains a large amount of hydrogen is likely to have normally-on characteristics. Moreover, hydrogen in an oxide semiconductor easily transferred by a stress such as heat or an electric field; thus, a large amount of hydrogen contained in an oxide semiconductor might reduce the reliability of the transistor. In one embodiment of the present invention, $V_O H$ in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose $V_O H$ is sufficiently reduced. When an oxide semiconductor with sufficiently reduced impurities such as $V_O H$ is used for a channel formation region of a transistor, stable electrical characteristics can be given.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm³, preferably greater than or equal to $1.0\times10^{19}$ atoms/cm³, further preferably greater than or equal to $2.0\times10^{19}$ atoms/cm³ or greater than or equal to $3.0\times10^{20}$ atoms/cm³ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_O H$ is cut occurs, i.e., a reaction of "$V_O H \rightarrow V_O + H$" occurs. Part of hydrogen generated at this time is bonded to oxygen to be $H_2O$, and removed from the oxide 530 or an insulator in the vicinity of the oxide 530 in some cases. Part of hydrogen may be gettered into the conductor 542 in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O + O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_O H$.

In the case where the insulator 524 includes an excess-oxygen region, it is preferable that the insulator 522 have a function of inhibiting diffusion of oxygen (e.g., an oxygen atom and an oxygen molecule) (or that the above oxygen be less likely to pass through the insulator 522).

The insulator 522 preferably has a function of inhibiting diffusion of oxygen or impurities, in which case oxygen contained in the oxide 530 is not diffused to the conductor 503 side. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO₃), or (Ba, Sr)TiO₃ (BST) are preferably used, for example. As miniaturization and high integration of transistors progress, a problem such as a leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

Note that in the transistor 500 in FIG. 22A and FIG. 22B, the insulator 522 and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor is described in detail in another embodiment.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530*a* under the oxide 530*b*, it is possible to inhibit diffusion of impurities into the oxide 530*b* from the components formed below the oxide 530*a*.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530*a* is preferably higher than the atomic ratio of the element M to the constituent elements in the metal oxide used as the oxide 530*b*. In addition, the atomic ratio of the element M to In in the metal oxide used as the oxide 530*a* is preferably higher than the atomic ratio of the element M to In in the metal oxide used as the oxide 530*b*. Furthermore, the atomic ratio of In to the element M in the metal oxide used as the oxide 530*b* is preferably higher than the atomic ratio of In to the element M in the metal oxide used as the oxide 530*a*.

The energy of the conduction band minimum of the oxide 530*a* is preferably higher than the energy of the conduction band minimum of the oxide 530*b*. In other words, the electron affinity of the oxide 530*a* is preferably smaller than the electron affinity of the oxide 530*b*.

Here, the energy level of the conduction band minimum gently changes at a junction portion of the oxide 530*a* and the oxide 530*b*. In other words, the energy level of the conduction band minimum at the junction portion of the oxide 530*a* and the oxide 530*b* continuously changes or is continuously connected. This can be obtained by decreasing the density of defect states in a mixed layer formed at the interface between the oxide 530*a* and the oxide 530*b*.

Specifically, when the oxide 530*a* and the oxide 530*b* contain a common element (as a main component) in addition to oxygen, a mixed layer with a low density of defect states can be formed. For example, in the case where the oxide 530*b* is an In—Ga—Zn oxide, an In—Ga—Zn oxide, a Ga—Zn oxide, gallium oxide, or the like is preferably used as the oxide 530*a*.

At this time, the oxide 530*b* serves as a main carrier path. When the oxide 530*a* has the above-described structure, the density of defect states at the interface between the oxide 530*a* and the oxide 530*b* can be made low. Thus, the influence of interface scattering on carrier conduction is small, and the transistor 500 can have a high on-state current.

The conductor 542*a* and the conductor 542*b* functioning as the source electrode and the drain electrode are provided over the oxide 530*b*. For the conductor 542*a* and the conductor 542*b*, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 22A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In addition, as illustrated in FIG. 22A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is determined as appropriate in consideration of required transistor characteristics.

When the insulator 544 is included, diffusion of impurities such as water and hydrogen contained in the insulator 580 into the oxide 530b through the insulator 545 can be inhibited. Furthermore, oxidation of the conductor 560 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water and hydrogen in the insulator 545 is preferably reduced. The thickness of the insulator 545 is preferably greater than or equal to 1 nm and less than or equal to 20 nm. Before and/or after formation of the insulator 545, the above-described microwave treatment may be performed.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as a leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 that functions as the first gate electrode and has a two-layer structure is illustrated in FIG. 22A and FIG. 22B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material that has a function of inhibiting diffusion of oxygen (e.g., at least one of an oxygen atom, an oxygen molecule, and the like). When the conductor 560a has a function of inhibiting diffusion of oxygen, a reduction in conductivity of the conductor 560b due to oxidation caused by oxygen contained in the insulator 545 can be inhibited. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably contained as the insulator 580. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water and hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited by a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water and hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structure of the conductor 540a and the conductor 540b is similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent entry of impurities such as hydrogen and moisture into the transistor 500 in the manufacturing process and after the manufacture of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using a material similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as some of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are described in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. For the insulator 640, a material similar to that for the insulator 320 can be used. In addition, the insulator 640 may function as a planarization film that covers an uneven shape therebelow.

With the use of this structure, a semiconductor device using a transistor including an oxide semiconductor can be miniaturized or highly integrated.

The composition, structure, method, and the like described in this embodiment can be used in combination as appropriate with the compositions, structures, methods, and the like described in the other embodiments, the example, and the like.

Embodiment 5

In this embodiment, the structure of an integrated circuit including components of the arithmetic processing system 100 described in the above embodiment will be described with reference to FIG. 23A and FIG. 23B.

Figure 23A:
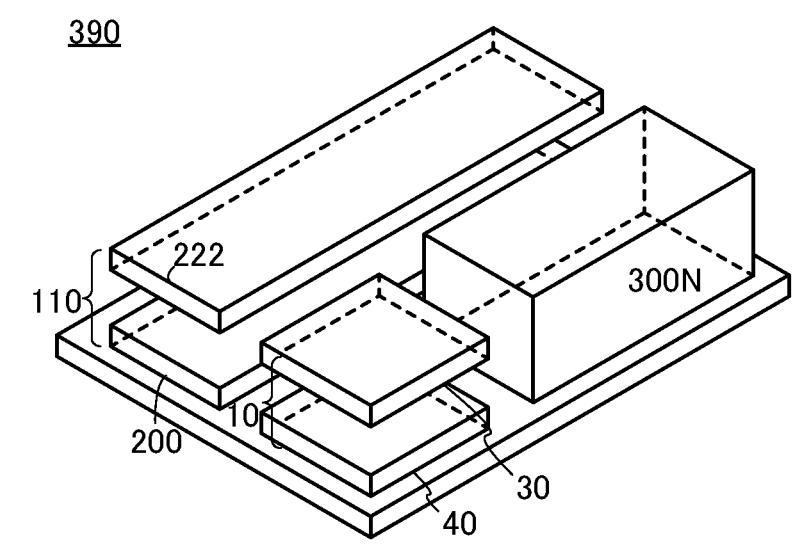
FIG. 23A and FIG. 23B are diagrams illustrating a struc- ture example of an integrated circuit.

FIG. 23A is an example of a schematic diagram illustrating the integrated circuit including the components of the arithmetic processing system 100. An integrated circuit 390 illustrated in FIG. 23A can be one integrated circuit in which circuits are integrated in such a manner that some of circuits included in the CPU 110 and the accelerator described as the semiconductor device 10 are formed using OS transistors.

As illustrated in FIG. 23A, in the CPU 110, the backup circuit 222 can be provided in the layer including OS transistors over the CPU core 200. Furthermore, as illustrated in FIG. 23A, in the accelerator described as the semiconductor device 10, the memory circuit portion 30 can be provided in the layer including OS transistors over the layer including Si transistors that form the arithmetic circuit portion 40. In addition, an OS memory 300N and the like can be provided in the layer including OS transistors. As the OS memory 300N, a DOSRAM as well as the NOSRAM described in the above embodiment can be used. In the OS memory 300N, the layer including OS transistors is stacked over the driver circuit provided in the layer including Si transistors, whereby the memory density can be improved.

In the case of the SoC in which the circuits such as the CPU 110, the accelerator described as the semiconductor device 10, and the OS memory 300N are tightly coupled as illustrated in FIG. 23A, although heat generation is a problem, an OS transistor is preferable because the amount of change in the electrical characteristics due to heat is small as compared with a Si transistor. By integration of the circuits in the three-dimensional direction as illustrated in FIG. 23A, parasitic capacitance can be reduced as compared with a stacked-layer structure using a through silicon via (TSV), for example. Power consumption needed for charging and discharging wirings can be reduced. Consequently, the arithmetic processing efficiency can be improved.

Figure 23B:
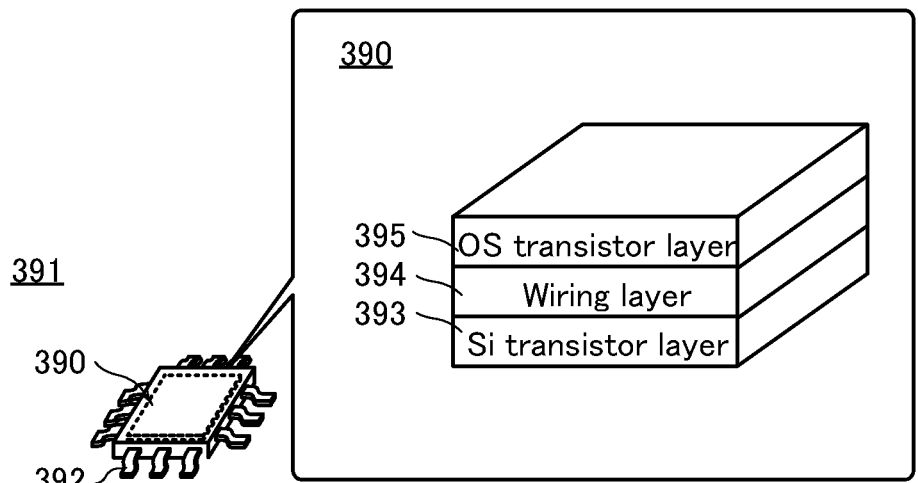

FIG. 23B illustrates an example of a semiconductor chip including the integrated circuit 390. A semiconductor chip 391 illustrated in FIG. 23B includes leads 392 and the integrated circuit 390. As for the integrated circuit 390, the various circuits described in the above embodiment are provided in one die as illustrated in FIG. 23A. The integrated circuit 390 has a stacked-layer structure, which is roughly divided into a layer including Si transistors (a Si transistor layer 393), a wiring layer 394, and a layer including OS transistors (an OS transistor layer 395). Since the OS transistor layer 395 can be provided to be stacked over the Si transistor layer 393, a reduction in the size of the semiconductor chip 391 is facilitated.

Although a QFP (Quad Flat Package) is used as the package of the semiconductor chip 391 in FIG. 23B, the form of the package is not limited thereto. For other structure examples, a DIP (Dual In-line Package) and a PGA (Pin Grid Array), which are of an insertion mount type; an SOP (Small Outline Package), an SSOP (Shrink Small Outline Package), a TSOP (Thin-Small Outline Package), an LCC (Leaded Chip Carrier), a QFN (Quad Flat Non-leaded package), a BGA (Ball Grid Array), and an FBGA (Fine pitch Ball Grid Array), which are of a surface mount type; a DTP (Dual Tape carrier Package) and a QTP (Quad Tape-carrier Package), which are of a contact mount type; and the like can be used as appropriate.

All the arithmetic circuit and the switching circuit including Si transistors and the memory circuits including OS transistors can be formed in the Si transistor layer 393, the wiring layer 394, and the OS transistor layer 395. In other words, elements included in the semiconductor device can be formed through the same manufacturing process. Thus, the number of steps in the manufacturing process of the IC illustrated in FIG. 23B does not need to be increased even when the number of elements is increased, and accordingly the semiconductor device can be incorporated into the IC at low cost.

According to one embodiment of the present invention described above, a novel semiconductor device and electronic device can be provided. Alternatively, according to one embodiment of the present invention, a semiconductor device and an electronic device having low power consumption can be provided. Alternatively, according to one embodiment of the present invention, a semiconductor device and an electronic device capable of suppressing heat generation can be provided.

This embodiment can be combined with the description of the other embodiments as appropriate.

Embodiment 6

In this embodiment, an electronic device, a moving object, and an arithmetic system in which the integrated circuit 390 described in the above embodiment can be used will be described with reference to FIG. 24 to FIG. 27.

Figures 24A, 24B:
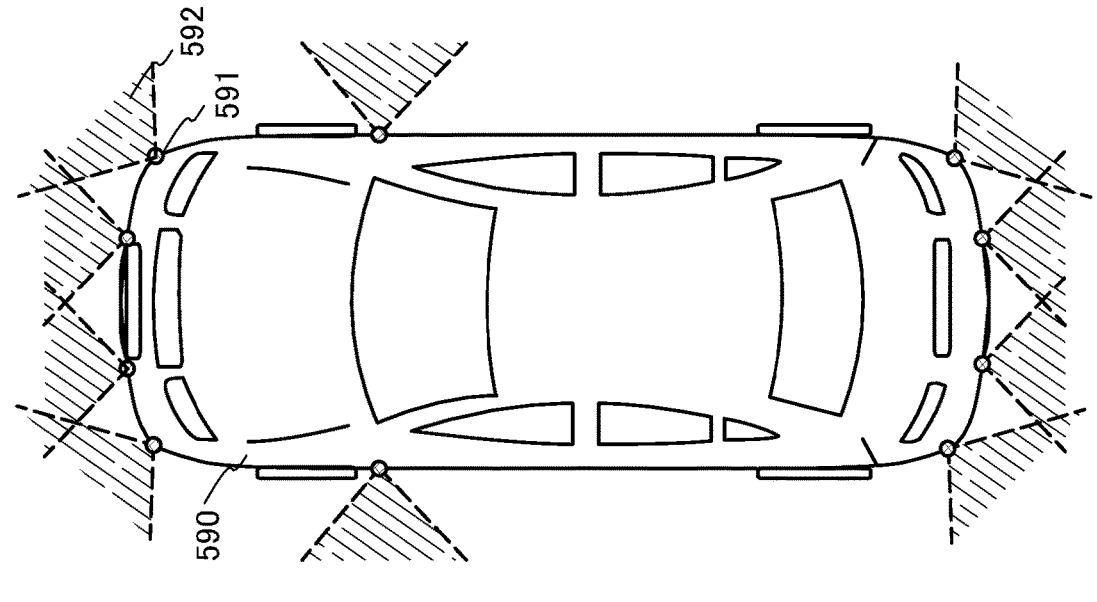
FIG. 24A and FIG. 24B are diagrams illustrating an application example of an integrated circuit.

FIG. 24A illustrates an external view of an automobile as an example of a moving object. FIG. 24B is a simplified diagram illustrating data transmission in the automobile. An automobile 590 includes a plurality of cameras 591 and the like. The automobile 590 also includes various sensors such as an infrared radar, a millimeter wave radar, and a laser radar (not illustrated) and the like.

In the automobile 590, the above-described integrated circuit 390 (or the semiconductor chip 391 including the integrated circuit 390) can be used for the camera 591 and the like. The automobile 590 can perform autonomous driving by judging surrounding traffic information such as the presence of a guardrail or a pedestrian in such a manner that the camera 591 processes a plurality of images taken in a plurality of imaging directions 592 with the integrated circuit 390 described in the above embodiment and the plurality of images are collectively analyzed with a host controller 594 and the like through a bus 593 and the like. The integrated circuit 390 can be used for a system for navigation, risk prediction, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Note that although an automobile is described above as an example of a moving vehicle, the moving vehicle is not limited to an automobile. Examples of moving objects also include a train, a monorail train, a ship, and a flying object (a helicopter, an unmanned aircraft (a drone), an airplane, and a rocket), and these moving objects can include a system utilizing artificial intelligence when equipped with a computer of one embodiment of the present invention.

Figures 25A, 25B:
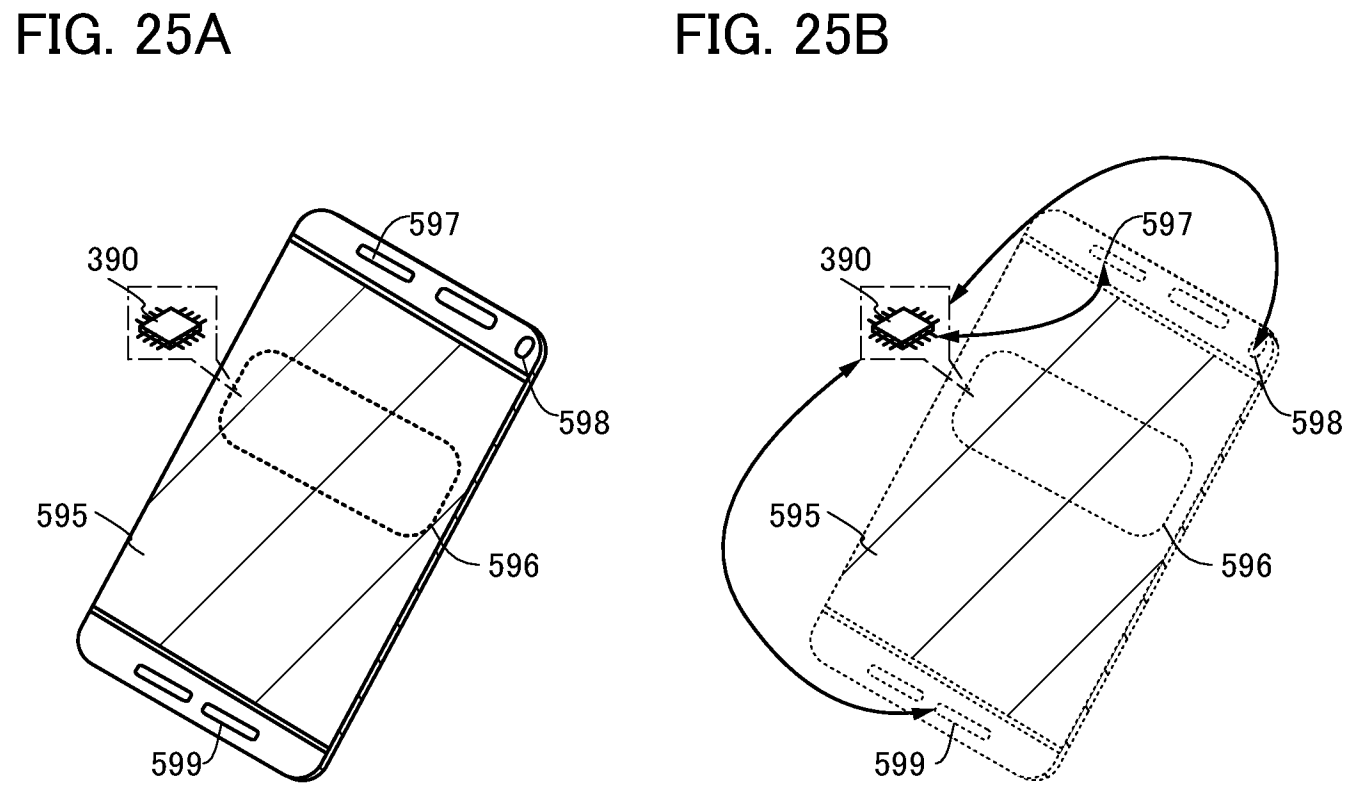

FIG. 25A is an external view illustrating an example of a portable electronic device. FIG. 25B is a simplified diagram illustrating data transmission in the portable electronic device. A portable electronic device 595 includes a printed wiring board 596, a speaker 597, a camera 598, a microphone 599, and the like.

In the portable electronic device 595, the printed wiring board 596 can be provided with the above-described integrated circuit 390. The portable electronic device 595 processes and analyzes a plurality of pieces of data obtained from the speaker 597, the camera 598, the microphone 599, and the like with the integrated circuit 390 described in the above embodiment, whereby the user's convenience can be improved. The integrated circuit 390 can be used for a system for voice guidance, image search, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Figure 26A:
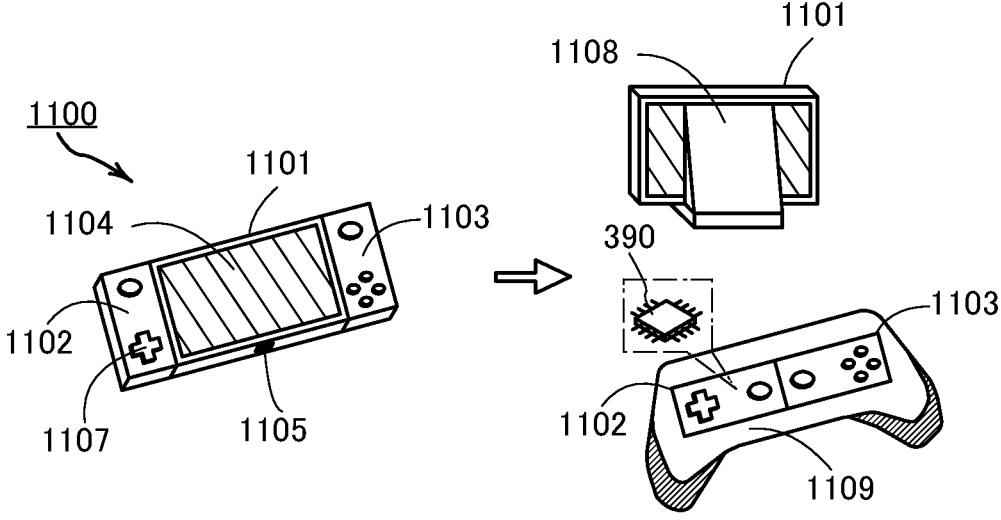
FIG. 26A, FIG. 26B, and FIG. 26C are diagrams each illustrating an application example of an integrated circuit.

A portable game machine 1100 illustrated in FIG. 26A includes a housing 1101, a housing 1102, a housing 1103, a display portion 1104, a connection portion 1105, operation keys 1107, and the like. The housing 1101, the housing 1102, and the housing 1103 can be detached. When the connection portion 1105 provided in the housing 1101 is attached to a housing 1108, a video to be output to the display portion 1104 can be output to another video device. Alternatively, the housing 1102 and the housing 1103 are attached to a housing 1109, whereby the housing 1102 and the housing 1103 are integrated and function as an operation portion. The integrated circuit 390 described in the above embodiment can be incorporated into a chip provided on a substrate in the housing 1102 and the housing 1103, for example.

Figure 26B:
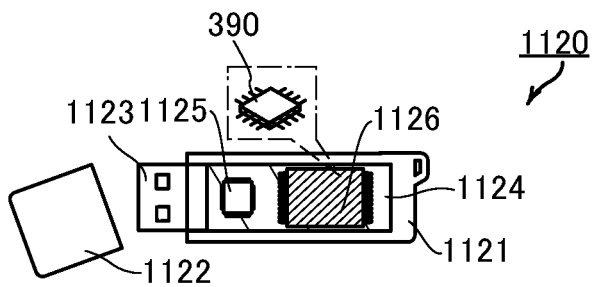

FIG. 26B is a USB connection stick type electronic device 1120. The electronic device 1120 includes a housing 1121, a cap 1122, a USB connector 1123, and a substrate 1124. The substrate 1124 is held in the housing 1121. For example, a memory chip 1125 and a controller chip 1126 are attached to the substrate 1124. The integrated circuit 390 described in the above embodiment can be incorporated into the controller chip 1126 or the like of the substrate 1124.

Figure 26C:
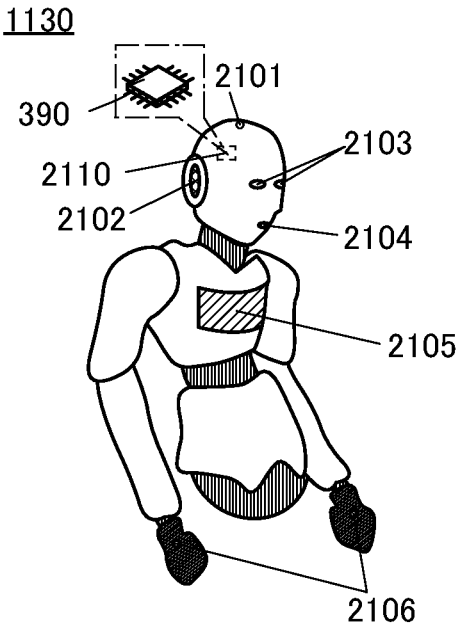

FIG. 26C is a humanoid robot 1130. The robot 1130 includes sensors 2101 to 2106 and a control circuit 2110. For example, the integrated circuit 390 described in the above embodiment can be incorporated into the control circuit 2110.

Figure 27:
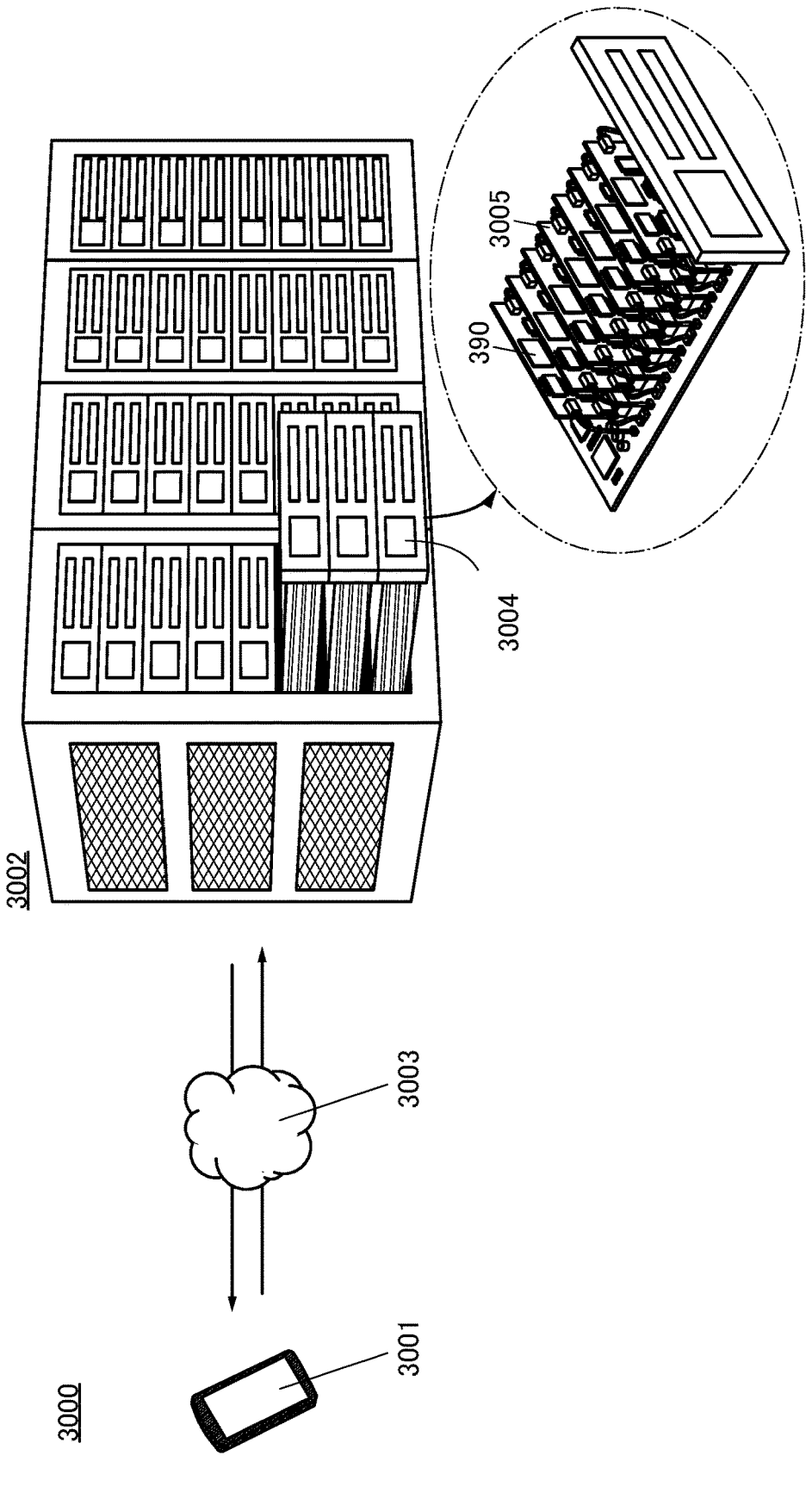
FIG. 27 is a diagram illustrating an application example of an integrated circuit.

The integrated circuit 390 described in the above embodiment can be used for a server that communicates with the electronic devices instead of being incorporated into the electronic devices. In that case, the arithmetic system is configured with the electronic devices and a server. FIG. 27 illustrates a structure example of a system 3000.

The system 3000 includes an electronic device 3001 and a server 3002. Communication between the electronic device 3001 and the server 3002 can be performed through Internet connection 3003.

The server 3002 includes a plurality of racks 3004. The plurality of racks are provided with a plurality of substrates 3005, and the integrated circuit 390 described in the above embodiment can be mounted on each of the substrates 3005. Thus, a neural network is configured in the server 3002. The server 3002 can perform arithmetic operation of the neural network using data input from the electronic device 3001 through the Internet connection 3003. The result of the arithmetic operation executed by the server 3002 can be transmitted as needed to the electronic device 3001 through the Internet connection 3003. Accordingly, a burden of the arithmetic operation in the electronic device 3001 can be reduced.

This embodiment can be combined with the description of the other embodiments as appropriate.

Supplementary Notes on Description in this Specification and the Like

The description of the above embodiments and each structure in the embodiments are noted below.

One embodiment of the present invention can be constituted by combining, as appropriate, the structure described in each embodiment with the structures described in the other embodiments and Example. In addition, in the case where a plurality of structure examples are described in one embodiment, the structure examples can be combined as appropriate.

Note that content (or part of the content) described in one embodiment can be applied to, combined with, or replaced with another content (or part of the content) described in the embodiment and/or content (or part of the content) described in another embodiment or other embodiments.

Note that in each embodiment, a content described in the embodiment is a content described with reference to a variety of drawings or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in this specification, and the description can be changed appropriately depending on the situation.

In drawings, the size, the layer thickness, or the region is shown arbitrarily for description convenience. Therefore, they are not limited to the illustrated scale. Note that the drawings are schematically shown for clarity, and embodiments of the present invention are not limited to shapes, values, or the like shown in the drawings. For example, variation in signal, voltage, or current due to noise or variation in signal, voltage, or current due to difference in timing can be included.

Furthermore, the positional relationship between components illustrated in the drawings and the like is relative. Therefore, when the components are described with reference to drawings, terms for describing the positional relationship, such as "over" and "under", are sometimes used for convenience. The positional relationship of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, voltage and potential can be replaced with each other as appropriate. The voltage refers to a potential difference from a reference potential, and when the reference potential is a ground voltage, for example, the voltage can be rephrased into the potential. The ground potential does not necessarily mean 0 V. Note that potentials are relative, and the potential supplied to a wiring or the like is changed depending on the reference potential, in some cases.

In this specification and the like, a node can be referred to as a terminal, a wiring, an electrode, a conductive layer, a conductor, an impurity region, or the like depending on a circuit structure, a device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electrical signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electrical signal transmission between A and B through a wiring (or an electrode) or the like, not through the above object. In other words, direct connection refers to connection that can be regarded as the same circuit diagram when indicated as an equivalent circuit.

In this specification and the like, a switch is in a conduction state (on state) or in a non-conduction state (off state) to determine whether current flows or not. Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms "film", "layer", and the like can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

C11: capacitor, CK1: node, D1: node, GCLK1: clock signal, LBL_n: wiring, LBL_N: wiring, LBL_1: wiring, LBL_4: wiring, LBL_6: wiring, M11: transistor, M12: transistor, M13: transistor, PSE0: signal, PSE1: signal, PSE2: signal, Q1: node, RWL_M: read word line, RWL_1: read word line, SLEEP1: signal, SN11: node, t1: time, t2: time, t3: time, t4: time, t5: time, t6: time, t7: time, T0: time, T1: time, T6: time, WBL_1: write bit line, WWL_M: write word line, WWL_1: write word line, 10: semiconductor device, 12: driver circuit, 13: driver circuit, 14: control circuit, 15: processing circuit, 20: arithmetic operation block, 21: transistor, 22: semiconductor layer, 23: transistor, 24: semiconductor layer, 30: memory circuit portion, 31: circuit block, 32: memory circuit, 32_N: memory circuit, 32_P: memory circuit, 32A: memory circuit, 32B: memory circuit, 32C: memory circuit, 40: arithmetic circuit portion, 41: switching circuit, 42: product-sum operation circuit, 43: activation function operation circuit, 44: quantization operation circuit, 44_1: quantization operation circuit, 44_9: quantization operation circuit, 45: pre-pooling operation circuit, 47: post-pooling operation circuit, 46: dedicated arithmetic circuit, 46_1: dedicated arithmetic circuit, 46_2: dedicated arithmetic circuit, 46_3: dedicated arithmetic circuit, 51: multiplier circuit, 52: adder circuit, 53: register, 54: multiplexer, 55: comparison circuit, 56: register, 61: transistor, 61_N: transistor, 61_P: transistor, 61A: transistor, 61B: transistor, 62: transistor, 62_N: transistor, 62_P: transistor, 62B: transistor, 63: transistor, 63_N: transistor, 63_P: transistor, 64: capacitor, 64_N: capacitor, 64_P: capacitor, 64A: capacitor, 64B: capacitor, 100: arithmetic processing system, 110: CPU, 120: bus, 130: accelerator portion, 131: control portion, 193: PMU, 200: CPU core, 202: cache memory device, 203: cache memory device, 205: bus interface portion, 210: power switch, 211: power switch, 212: power switch, 214: level shifter, 220: flip-flop, 221: scan flip-flop, 221A: clock buffer circuit, 222: backup circuit, 300N: OS memory, 311: substrate, 312: well region, 313: insulator, 314: oxide layer, 315: semiconductor region, 316a: low-resistance region, 316b: low-resistance region, 316c: low-resistance region, 317: insulator, 318: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 390: integrated circuit, 391: semiconductor chip, 392: lead, 393: Si transistor layer, 394: wiring layer, 395: OS transistor layer, 500: transistor, 503: conductor, 503a: conductor, 503b: conductor, 510: insulator, 512: insulator, 514: insulator, 516: insulator, 518: conductor, 522: insulator, 524: insulator, 530: oxide, 530a: oxide, 530b: oxide, 540a: conductor, 540b: conductor, 542: conductor, 542a: conductor, 542b: conductor, 543a: region, 543b: region, 544: insulator, 545: insulator, 546: conductor, 548: conductor, 550: transistor, 560: conductor, 560a: conductor, 560b: conductor, 574: insulator, 580: insulator, 581: insulator, 582: insulator, 586: insulator, 590: automobile, 591: camera, 592: imaging direction, 593: bus, 594: host controller, 595: portable electronic device, 596: printed wiring board, 597: speaker, 598: camera, 599: microphone, 600: capacitor, 610: conductor, 612: conductor, 620: conductor, 630: insulator, 640: insulator, 1100: portable game machine, 1101: housing, 1102: housing, 1103: housing, 1104: display portion, 1105: connection portion, 1107: operation key, 1108: housing, 1109: housing, 1120: electronic device, 1121: housing, 1122: cap, 1123: USB connector, 1124: substrate, 1125: memory chip, 1126: controller chip, 1130: robot, 2101: sensor, 2106: sensor, 2110: control circuit, 3000: system, 3001: electronic device, 3002: server, 3003: Internet connection, 3004: rack, 3005: substrate

The invention claimed is:

1. A semiconductor device comprising a plurality of memory circuits, a switching circuit, a first arithmetic circuit, and a second arithmetic circuit, wherein the plurality of memory circuits are each configured to retain weight data, wherein the switching circuit is configured to switch electrical continuity and discontinuity between any one of the plurality of memory circuits and the first arithmetic circuit, wherein the first arithmetic circuit outputs a first output signal based on product-sum operation processing of input data and the weight data selected by the switching circuit to the second arithmetic circuit, and wherein the plurality of memory circuits are provided in a layer stacked over a layer comprising the switching circuit, the first arithmetic circuit, and the second arithmetic circuit.

2. The semiconductor device according to claim 1, wherein the memory circuits each comprise a first transistor, and wherein the first transistor comprises a semiconductor layer comprising a metal oxide in a channel formation region.

3. The semiconductor device according to claim 2, wherein the metal oxide comprises In, Ga, and Zn.

4. The semiconductor device according to claim 1, wherein the switching circuit, the first arithmetic circuit, and the second arithmetic circuit each comprise a second transistor, and wherein the second transistor comprises a semiconductor layer comprising silicon in a channel formation region.

5. A semiconductor device comprising a plurality of memory circuits, a switching circuit, a first arithmetic circuit, and a second arithmetic circuit, wherein the plurality of memory circuits are each configured to retain weight data, wherein the switching circuit is configured to switch electrical continuity and discontinuity between any one of the plurality of memory circuits and the first arithmetic circuit, wherein the first arithmetic circuit outputs a first output signal based on product-sum operation processing of input data and the weight data selected by the switching circuit to the second arithmetic circuit, wherein the second arithmetic circuit is configured to perform activation function operation processing, quantization operation processing, and first pooling operation processing, and wherein the plurality of memory circuits are provided in a layer stacked over a layer comprising the switching circuit, the first arithmetic circuit, and the second arithmetic circuit.

6. The semiconductor device according to claim 5, wherein the memory circuits each comprise a first transistor, and wherein the first transistor comprises a semiconductor layer comprising a metal oxide in a channel formation region.

7. The semiconductor device according to claim 6, wherein the metal oxide comprises In, Ga, and Zn.

8. The semiconductor device according to claim 5, wherein the switching circuit, the first arithmetic circuit, and the second arithmetic circuit each comprise a second transistor, and wherein the second transistor comprises a semiconductor layer comprising silicon in a channel formation region.

9. A semiconductor device comprising a plurality of memory circuits, a switching circuit, a first arithmetic circuit, a second arithmetic circuit, and a third arithmetic circuit, wherein the plurality of memory circuits are each configured to retain weight data, wherein the switching circuit is configured to switch electrical continuity and discontinuity between any one of the plurality of memory circuits and the first arithmetic circuit, wherein the first arithmetic circuit outputs a first output signal based on product-sum operation processing of input data and the weight data selected by the switching circuit to the second arithmetic circuit, wherein the second arithmetic circuit is configured to perform activation function operation processing, quantization operation processing, and first pooling operation processing, wherein the third arithmetic circuit is configured to perform second pooling operation processing of a second output signal output from the second arithmetic circuit, and wherein the plurality of memory circuits are provided in a layer stacked over a layer comprising the switching circuit, the first arithmetic circuit, and the second arithmetic circuit.

10. The semiconductor device according to claim 9, wherein the memory circuits each comprise a first transistor, and wherein the first transistor comprises a semiconductor layer comprising a metal oxide in a channel formation region.

11. The semiconductor device according to claim 10, wherein the metal oxide comprises In, Ga, and Zn.

12. The semiconductor device according to claim 9, wherein the switching circuit, the first arithmetic circuit, and the second arithmetic circuit each comprise a second transistor, and wherein the second transistor comprises a semiconductor layer comprising silicon in a channel formation region.

* * * * *